(12) United States Patent
Ho et al.

(10) Patent No.: US 7,973,366 B2
(45) Date of Patent: Jul. 5, 2011

(54) DUAL-GATE, SONOS, NON-VOLATILE MEMORY CELLS AND ARRAYS THEREOF

(75) Inventors: Chia-Hua Ho, Kaohsiung (TW); Hang-Ting Lue, Hsinchu (TW); Yen-Hao Shih, Changhua (TW); Erh-Kun Lai, Longjing Shiang (TW); Kuang-Yeu Hsieh, Jhubei (TW)

(73) Assignee: Macronix International Co., Ltd., Hsinchu (TW)

( * ) Notice: Subject to any disclaimer, the term of this patent is extended or adjusted under 35 U.S.C. 154(b) by 187 days.

(21) Appl. No.: 11/352,788

(22) Filed: Feb. 13, 2006

(65) Prior Publication Data
US 2007/0201276 A1   Aug. 30, 2007

(51) Int. Cl.
*H01L 29/792* (2006.01)
(52) U.S. Cl. .......... 257/365; 257/E29.309; 438/157
(58) Field of Classification Search .......... 257/365, 257/E29.309; 438/157
See application file for complete search history.

(56) References Cited

U.S. PATENT DOCUMENTS

| | | | |
|---|---|---|---|
| 5,168,334 A | 12/1992 | Mitchell et al. | |
| 5,498,888 A * | 3/1996 | Ozawa | 257/295 |
| 5,691,938 A | 11/1997 | Yiu et al. | |
| 6,011,725 A | 1/2000 | Eitan | |
| 6,151,248 A | 11/2000 | Harari et al. | |
| 6,232,180 B1 * | 5/2001 | Chen | 438/257 |
| 6,538,276 B2 | 3/2003 | Hsieh et al. | |
| 6,590,266 B1 | 7/2003 | Liu et al. | |
| 6,649,971 B1 | 11/2003 | Yeh et al. | |
| 6,674,133 B2 | 1/2004 | Chang | |
| 6,750,150 B2 | 6/2004 | Chung et al. | |
| 6,868,009 B1 | 3/2005 | Hung et al. | |
| 6,888,755 B2 | 5/2005 | Harari | |
| 7,106,625 B2 * | 9/2006 | Yeh | 365/185.03 |
| 7,120,059 B2 * | 10/2006 | Yeh | 365/185.19 |
| 7,209,386 B2 * | 4/2007 | Yeh | 365/185.03 |
| 2003/0216051 A1 | 11/2003 | Chung et al. | |
| 2003/0224602 A1 | 12/2003 | Chung et al. | |
| 2005/0145911 A1 | 7/2005 | Forbes et al. | |
| 2005/0162958 A1 * | 7/2005 | Chae et al. | 365/222 |
| 2006/0114722 A1 * | 6/2006 | Yokoi et al. | 365/185.18 |
| 2006/0157773 A1 * | 7/2006 | Yu et al. | 257/314 |

FOREIGN PATENT DOCUMENTS

| | | |
|---|---|---|
| CN | 1674299 | 9/2005 |
| CN | 1722444 | 1/2006 |

OTHER PUBLICATIONS

Claim recitation for U.S. Appl. No. 11/085,300.*

(Continued)

*Primary Examiner* — Leonardo Andújar
*Assistant Examiner* — Christopher M Roland
(74) *Attorney, Agent, or Firm* — Jianq Chyun IP Office

(57) ABSTRACT

Memory cells which include a semiconductor substrate having a source region and a drain region separated by a channel region; a charge-trapping structure disposed above the channel region of the semiconductor substrate; a first gate disposed above the charge-trapping structure and proximate to the source region; and a second gate disposed above the charge-trapping structure and proximate to the drain region; where the first gate and the second gate are separated by a first nanospace are provided, along with arrays including a plurality of such cells, methods of manufacturing such cells and methods of operating such cells.

13 Claims, 22 Drawing Sheets

OTHER PUBLICATIONS

Claim recitation for U.S. Appl. No. 11/356,659.*
Claim recitation for U.S. Appl. No. 11/085,300, filed Oct. 22, 2008.*
Claim recitation for U.S. Appl. No. 11/356,659, filed Aug. 25, 2008.*

* cited by examiner

DUAL-GATE, SONOS, NON-VOLATILE MEMORY CELLS AND ARRAYS THEREOF

BACKGROUND OF THE INVENTION

Non-volatile memory ("NVM") refers to semiconductor memory which is able to continually store information even when the supply of electricity is removed from the device containing the NVM cell. NVM includes Mask Read-Only Memory (Mask ROM), Programmable Read-Only Memory (PROM), Erasable Programmable Read-Only Memory (EPROM), Electrically Erasable Programmable Read-Only Memory (EEPROM), and Flash Memory. Non-volatile memory is extensively used in the semiconductor industry and is a class of memory developed to prevent loss of programmed data. Typically, non-volatile memory can be programmed, read and/or erased based on the device's end-use requirements, and the programmed data can be stored for a long period of time.

As the information technology market has grown vastly in the past twenty years or so, portable computers and the electronic communications industry have become the main driving force for semiconductor VLSI (very large scale integration) and ULSI (ultra large scale integration) design. As a result, low power consumption, high density and re-programmable non-volatile memory are in great demand. These types of programmable and erasable memories have become essential devices in the semiconductor industry.

A rising demand for memory capacity has translated into higher requirements for integration level and memory density. Dual bit cells which can store two bits of information in each memory cell are known in the art but are not yet prevalent in use. Some dual bit cells have multiple threshold voltage levels, where every two threshold voltage levels together store a different bit. These types of dual bit cells involve operational complexities which discourage their widespread use. Other dual bit cells have two separate storage sites and store one bit in each site on either side of the cell. One kind of dual bit cell of the latter variety is known as Nitride Read Only Memory (NROM).

Nitride read only memory is a type of charge-trapping semiconductor device for data storage. In general, an NROM cell is composed of a MOSFET (metal-oxide-silicon field effect transistor) having an ONO (oxide-nitride-oxide) gate dielectric layer disposed between the gate and the source/drain semiconductor material. The nitride layer in the ONO gate dielectric layer is able to trap electrons in a localized manner when programmed. Charge localization refers to the nitride material's ability to store the charge without much lateral movement of the charge throughout the nitride layer. This is in contrast to conventional floating gate technology wherein the floating gate is conductive and the charge is spread laterally throughout the entire floating gate. Programming (i.e., charge injection) of the charge-trapping layer in NROM devices can be carried out via channel hot electron ("CHE") injection. Erasing (i.e., charge removal) in NROM devices can be carried out via band-to-band hot hole tunneling. The stored charge can be repeatedly programmed, read, erased and/or reprogrammed via known voltage application techniques, and reading can be carried out in a forward or reverse direction. Localized charge-trapping technology allows two separate bits per cell, thus doubling memory density.

Although localized charge-trapping read only memory, such as NROM, has the advantage of two-bit storage in each cell, the constant industry demand to reduce overall memory cell dimensions has adverse implications for this technology. The trend in integrated circuit manufacture to produce memory cells with reduced feature sizes can result in unwanted phenomena. This is particularly true for MOSFETs as one of the dimensions thus reduced is channel length (i.e., the distance between the source and drain regions). As MOSFET channel length is reduced, charges in depletion regions near the source and/or drain may link with charges in the channel region, thereby skewing the threshold voltage, increasing the occurrence of unwanted "punch-through" and altering other device characteristics of the MOSFET. These effects are collectively known as "short-channel effects." A number of prior art devices have been proposed to address the short-channel effects. Some have proposed reducing the dimensions of the source and drain depletion regions. Such a reduction, however, has an unintended adverse effect of increasing bit-line (source/drain) resistance, which in turn can affect the voltage-current characteristics of the device and/or increase the heat produced by the device.

Another problem encountered in localized charge-trapping dual bit cells, such as NROM cells, is the so-called "second-bit effect", which can become more pronounced in short channel devices. The second-bit effect refers to the adverse effects one stored bit (trapped charge) has on the manipulation (e.g., programming and/or reading) of the other bit. For example, in some cases, when programming a second bit by channel hot electron injection there is a possibility that some electrons will be unintentionally injected into the charge-trapping layer at the first bit location, especially where the channel length is short and the first and second bits are closer to each other. As a result of this type of unintentional electron injection, the already programmed first bit can be "overwritten" (i.e., over-programmed), which in turn affects the width of the depletion layer under the expanded bit. As channel length decreases the possibility of overwriting increases. In addition, the overwriting effect described above also can lead to the second-bit effect characterized by alteration of the threshold voltage of the other bit during its reading operation.

Another problem encountered in memory devices, such as those which use channel hot electron programming and/or band-to-band hot hole erasing methods, is breakdown between the source/drain regions and gate, which results from the high voltage differential between the source/drain regions and the gate. Buried-diffusion oxide materials deposited above the source/drain regions have been used to decrease the possibility of breakdown between the source/drain regions and the gate. However, as memory cells become smaller and smaller, conventional buried-diffusion oxides become less capable of preventing or diminishing breakdown because their dielectric properties are insufficient at decreased dimensions.

Despite these problems encountered with the scale down of charge-trapping memory cells, interest in their production, architecture and use continues to grow. It is expected that NROM technology will eventually compete with conventional floating gate technology for many NVM applications. Accordingly, it is desirable to provide a charge-trapping NVM cell structure capable of decreased dimensioning and to provide a method for manufacture of such an NVM cell in which short-channel effects, the second-bit effect and breakdown between the source/drain and gate are minimized.

BRIEF SUMMARY OF THE INVENTION

The present invention relates, in general, to non-volatile memory cells for semiconductor devices, methods of manufacturing such non-volatile memory cells, and to methods of operating such non-volatile memory cells. More particularly, the present invention relates to non-volatile memory cells having at least two separate gates above the channel region of the cell. Accordingly, the present invention relates to multi-bit (i.e., at least two-bit) memory cells wherein each bit is associated with a separately controllable gate. The present invention also relates to methods of manufacturing memory cells having at least two separate gates above the channel region of the cell, and to methods of operating such cells.

Memory cells in accordance with the present invention provide significantly improved operational performance. The separately controllable gates, one associated with (or closer to) a source region and one associated with, or closer to, a drain region, and the optionally physically separated charge-trapping sites can provide improved voltage control across the channel length. This can allow more precise programming of each bit and can reduce over-writing. In addition, the separately controllable gates can also reduce the second-bit effect that negatively affects one bit when programming the neighboring bit. Additionally, reading can be performed in a forward direction with more accuracy (i.e., programmed bits are less frequently misread as unprogrammed and vice versa).

One embodiment of the present invention includes memory cells which include a semiconductor substrate having a source region and a drain region separated by a channel region; a charge-trapping structure disposed above the channel region of the semiconductor substrate; a first gate disposed above the charge-trapping structure and proximate to the source region; and a second gate disposed above the charge-trapping structure and proximate to the drain region; where the first gate and the second gate are separated by a first nanospace.

In certain preferred embodiments of the present invention, the charge-trapping structure includes two discrete charge-trapping regions separated by a second nanospace, where one charge-trapping region is proximate to the source region and the other charge-trapping region is proximate to the drain region.

In certain preferred embodiments of the invention, the charge-trapping structure includes a nitride storage material and the memory cell is a nitride read only memory ("NROM") device.

Another embodiment of the present invention includes memory arrays which have a plurality of memory cells according to one or more of the various embodiments of the present invention.

Another embodiment of the present invention includes methods which include providing a semiconductor substrate having a source region and a drain region separated by a channel region, a charge-trapping structure disposed above the channel region of the semiconductor substrate, and a gate material disposed above the charge-trapping structure; forming a patterning layer above the gate material such that a first nanoarea above the channel region is exposed; and removing the gate material below the first nanoarea to form a first gate and a second gate separated by a first nanospace, where the first gate is proximate to the source region and the second gate is proximate to the drain region.

Another embodiment of the present invention includes methods which include providing a semiconductor substrate having a charge-trapping structure disposed above a surface of the semiconductor substrate, and a gate material disposed above the charge-trapping structure; forming two gate patterns above the gate material, where the two gate patterns are separated such that a first nanoarea above the gate material between the two gate patterns and areas adjacent to opposite sides of the two gate patterns above the gate material are exposed; removing the exposed gate material below the first nanoarea and the areas adjacent to the opposite sides of the gate patterns to form a first gate and a second gate separated by a first nanospace; forming a spacer dielectric material between the first gate and the second gate and on opposite sides of the first gate and the second gate; and forming a source region and a drain region in the semiconductor substrate.

In certain preferred embodiments of the methods of manufacturing of the present invention, the patterning layer/gate patterns can include a photoresist material covered by a conformal coating, and more preferably a conformal coating comprising a fluorine-substituted hydrocarbon polymer material.

Another embodiment of the present invention includes methods which include providing a memory cell comprising a semiconductor substrate having a source region and a drain region separated by a channel region, a charge-trapping structure disposed above the channel region of the semiconductor substrate, a first gate disposed above the charge-trapping structure and proximate to the source region, and a second gate disposed above the charge-trapping structure and proximate to the drain region, where the first gate and the second gate are separated by a first nanospace, and where the memory cell has a threshold voltage; applying a source-drain voltage differential $V^s$-$V^d$ across the channel region; applying a first gate voltage $V^{g1}$ to the first gate and a second gate voltage $V^{g2}$ to the second gate; and optionally, further determining the channel current at the drain region.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiments which are presently preferred. It should be understood, however, that the invention is not limited to the precise arrangements and instrumentalities shown.

In the drawings.

DETAILED DESCRIPTION OF THE INVENTION

Figure 1:
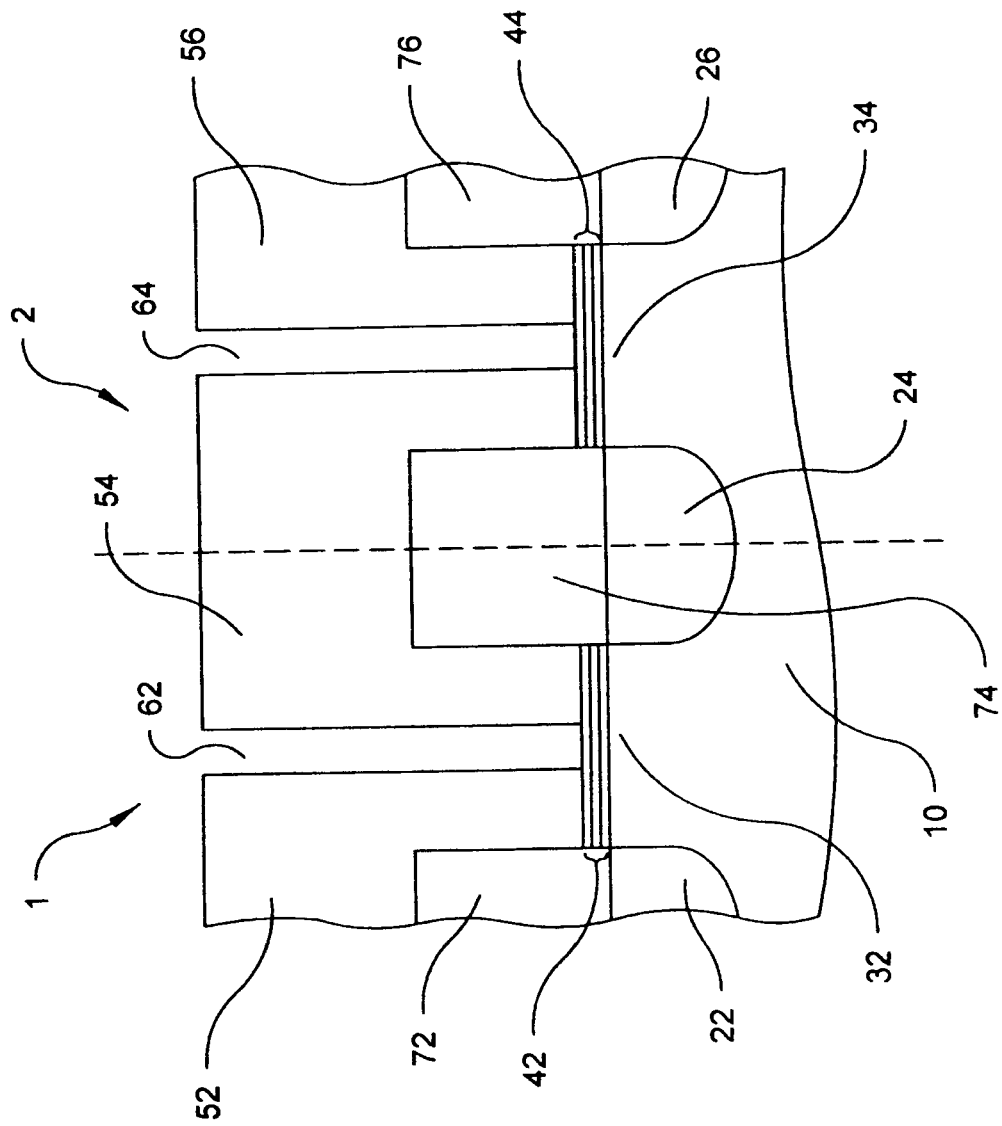
FIG. 1 is a cross-sectional schematic representation of two adjacent memory cells in accordance with an embodiment of the present invention.

Reference will now be made in detail to the invention and the presently preferred embodiments thereof, examples of which are illustrated in the accompanying drawings. Wherever possible, the same or similar reference numbers are used in the drawings and the description to refer to the same or like parts. It should be noted that the drawings are in greatly simplified form and are not to precise scale. In reference to the disclosure herein, for purposes of convenience and clarity only, directional terms, such as top, bottom, left, right, up, down, above, below, beneath, rear, and front, are used with respect to the accompanying drawings. Such directional terms used in conjunction with the following description of the drawings should not be construed to limit the scope of the invention in any manner not explicitly set forth in the appended claims. Although the disclosure herein refers to certain illustrated embodiments, it is to be understood that these embodiments are presented by way of example and not by way of limitation. It is to be understood and appreciated that the process steps and structures described herein do not cover a complete process flow for the manufacture of entire integrated circuits. The present invention may be practiced in conjunction with various integrated circuit fabrication techniques that can be used in the art either known or to be developed.

FIG. 1 illustrates two adjacent non-volatile memory cells 1, 2 in accordance with one embodiment of the present invention. The two memory cells 1, 2 can be part of a memory array comprising numerous memory cells. The individual memory cells 1, 2 are graphically segregated for visualization purposes by the vertical dashed line in the figure. Each of the two memory cells depicted in FIG. 1 comprises a semiconductor substrate 10 having two source/drain regions 22, 24, 26. As shown in FIG. 1, two adjacent memory cells 1, 2 may share a source/drain region 24. Each memory cell has a channel region 32, 34 situated between the memory cell's source/drain regions 22, 24, 26. Each memory cell comprises a charge-trapping structure 42, 44 disposed above the channel regions 32, 34. In certain preferred embodiments according to the present invention, the charge-trapping structure can comprise an oxide/nitride/oxide tri-layer, also referred to as an ONO tri-layer. In FIG. 1, charge-trapping structures 42, 44 are depicted as ONO tri-layers. As shown in FIG. 1, a memory cell in accordance with the present invention may optionally also comprise a first dielectric material 72, 74, 76 disposed above one or more or, in certain preferred embodiments, each of the source/drain regions 22, 24, 26. Each memory cell comprises two gates 52, 54, 56. For example, in memory cell 1, a first gate is represented by gate 52 and a second gate is represented by gate 54, and in memory cell 2, a first gate is represented by gate 54 and a second gate is represented by gate 56. In certain preferred embodiments of the present invention, a gate can comprise a lower layer of polycrystalline silicon and an upper layer of a metal-containing material such as, for example, a metal silicide. In each memory cell, the two gates are separated by a first nanospace 62, 64. Thus, for example, in memory cell 1, gate 52 and gate 54 are separated by first nanospace 62, and in memory cell 2, gate 54 and gate 56 are separated by first nanospace 64.

Figure 2:
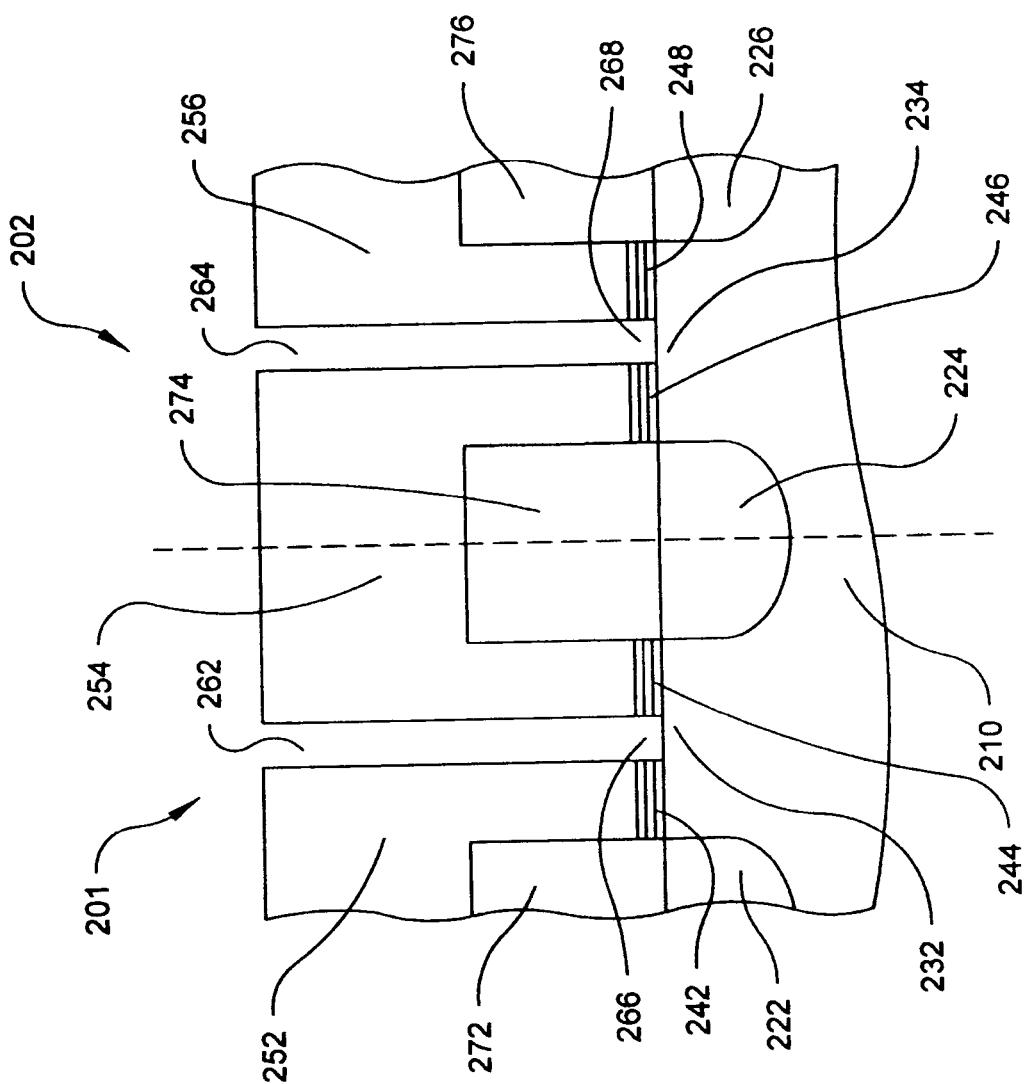
FIG. 2 is a cross-sectional schematic representation of two adjacent memory cells in accordance with another embodiment of the present invention.

FIG. 2 illustrates two adjacent non-volatile memory cells 201, 202 in accordance with another embodiment of the present invention. The two memory cells 201, 202 can be part of a memory array comprising numerous memory cells. The individual memory cells 201, 202 are graphically segregated by the vertical dashed line in the figure. Each of the two memory cells depicted in FIG. 2 comprises a semiconductor substrate 210 having two source/drain regions 222, 224, 226. Each memory cell has a channel region 232, 234 situated between the memory cell's source/drain regions 222, 224, 226. In certain embodiments of the present invention, such as the embodiment depicted in FIG. 2, a charge-trapping structure can comprise two discrete charge-trapping regions 242, 244, disposed above the channel region 232, separated by a second nanospace 266 such as in memory cell 201, and two discrete charge-trapping regions 246, 248, disposed above the channel region 234, separated by a second nanospace 268 in memory cell 202. In certain preferred embodiments according to the present invention, the charge-trapping structure (i.e., the two discrete charge-trapping regions) can comprise ONO tri-layers. In FIG. 2, charge-trapping regions 242, 244, 246, 248 are depicted as ONO tri-layers. As shown in FIG. 2, the memory cell may optionally also comprise a first dielectric material 272, 274, 276 disposed above one or more or, in certain preferred embodiments, each of the source/drain regions 222, 224, 226. Each memory cell comprises two gates 252, 254, 256. For example, in memory cell 201, a first gate is represented by gate 252 and a second gate is represented by gate 254, and in memory cell 202, a first gate is represented by gate 254 and a second gate is represented by gate 256. In certain preferred embodiments of the present invention, a gate can comprise a lower layer of polycrystalline silicon and an upper layer of a metal-containing material such as, for example, a metal silicide. In each memory cell, the two gates are separated by a first nanospace 262, 264.

A memory cell in accordance with the present invention comprises a semiconductor substrate. Any substrate material suitable for use in semiconductor devices may be used. In many preferred embodiments of the present invention, the semiconductor substrate comprises a silicon material. Silicon wafers prepared via standard techniques can be used to prepare a suitable substrate. For example, suitable wafers can be prepared via a process wherein silicon is grown from a small crystal, called the seed crystal, rotated and slowly withdrawn from a molten hyper-pure silicon to give a cylindrical crystal, which is then sliced to obtain thin disks, which after slicing, are finely ground, mirror-smooth polished and cleaned.

In accordance with several preferred embodiments of the present invention, the silicon semiconductor substrate comprises p-type silicon. Generally, p-type silicon substrates capable of use in accordance with preferred embodiments of the present invention include silicon wafers which have been lightly p-doped. In those embodiments of the present invention wherein the source/drain regions comprise n+doped implants, a lightly p-doped substrate can be advantageous in programming and reading of the memory cell due to the reverse bias of the PN junctions. P-type doping of silicon can be carried out in any suitable manner, such as, via an implantation of, for example, boron, $BF_2$ or gallium or any other free-electron deficient element capable of use in semiconductor materials. Preferably, the p-type doping is carried out at a dosage level of from about $10^{13}/cm^3$ to about $10^{16}/cm^3$ More preferably, the p-type doping is carried out at a dosage level of from about $10^{14}/cm^3$ to about $10^{15}/cm^3$.

It should be understood that while many of the preferred embodiments of the invention described herein depict NPN junctions wherein the semiconductor substrate comprises p-type silicon having two or more source/drain regions formed via n-type doping, the memory cells of the present invention also include PNP type semiconductor devices, and the methods of the present invention can be employed to prepare PNP memory.

A memory cell in accordance with the present invention has a source region and a drain region, which are collectively also referred to herein as at least two source/drain regions. As is understood by those of ordinary skill in the art, each memory cell comprises two source/drain regions, each of which may serve as a source or a drain, depending upon the location and level of the applied voltages. The term "source/drain region", as used herein, refers to the dual nature of such regions in that they can function as either a source or a drain depending upon the applied voltage. When referring to a specific operation in a memory cell in accordance with the present invention wherein one region serves as the source and the other region serves as the drain, the terms "source" and "drain" may be used separately in reference to the particular region. However, the use of either term separately is not to be construed as limiting either region in its function, or as limiting the invention in regard to any specific location of the source and the drain.

A memory device in accordance with the present invention may comprise a semiconductor substrate having more than two source/drain regions constituting a plurality of memory cells. It is to be understood that any one source/drain region may function as a source or drain for both adjacent regions, or it may function as a drain for a source adjacent in one direction and as a source for a drain adjacent in another direction. For example, referring to FIG. 1, source/drain region 24 may serve as the source for both source/drain region 22 and source/drain region 26, when regions 22 and 26 operate as drains, or as the drain for both when they operate as sources. Alternatively, for example, source/drain region 24 can serve as a drain for source/drain region 22 to the left when region 22 operates as a source, and as a source for source/drain region 26 to the right when region 26 operates as a drain.

In general, the at least two source/drain regions will each comprise an area doped in a manner corresponding in complementary fashion to the type of substrate doping employed. In other words, where a p-type substrate is employed, the source/drain regions are n-doped, and vice versa. Thus, in preferred embodiments wherein the substrate comprises p-type silicon, the at least two source/drain regions will comprise n+doped regions, preferably having a high dose of n-type doping. In more preferred embodiments of the present invention, the n+doping will comprise ion implantation of one or more elements selected from arsenic, phosphorous, and nitrogen, wherein the dosage of ion implantation is about $10^{19}/cm^3$ to $10^{20}/cm^3$. The depth of the implantation of each of the at least two source/drain regions in the silicon substrate can extend about 30 to about 200 nanometers below the substrate surface, depending on the technology generation or node of the device (i.e., the minimum feature size, for example 130 nm). For example, in one embodiment of the present invention with a generation node of 130 nanometers, the depth of the implantation of the at least two source/drain regions can be about 100 nanometers into the substrate as measured from the substrate surface.

The present invention also includes memory arrays comprising a plurality of memory cells. In certain embodiments of memory arrays in accordance with the present invention, two or more memory cells can be aligned in a row such that the source/drain regions on either side of the row of the two or more cells comprise continuous buried diffusion bit lines. Each bit line comprises a continuous sub-surface doped portion of the substrate.

Additionally, in certain embodiments of the present invention, pocket implantation of oppositely doped regions adjacent to one or more of the source/drain (or bit line) regions may be carried out. For example, where the at least two source/drain regions comprise n+doped regions, additional pocket implantation of highly p-doped smaller areas adjacent to one or more of the source/drain regions may be carried out. Thus, memory cells in accordance with the present invention may further comprise an oppositely doped pocket implant adjacent to one or more of the source/drain regions.

Any method for carrying out ion implantation known in the art or to be developed may be employed for doping of a region in accordance with various embodiments of the present invention.

Memory cells in accordance with the present invention may optionally include a first dielectric material which can be disposed on a surface of the substrate above one or more of the at least two source/drain regions. Suitable dielectric materials include, for example, oxides and other low-k dielectric materials which may be deposited by chemical-vapor-deposition (CVD) methods, such as high density plasma CVD (HD-PCVD), plasma-enhanced CVD (PECVD), and low-pressure CVD (LPCVD). Other suitable low-k dielectric materials include, for example, SiLK® resins (Dow Chemicals), polytetrafluoroethylenes (PTFE's), biphenyl dianhydride phenylene diamine (BPDA-PDA), benzocyclobutene (BCB), and hydrogen silsesquioxane (HSQ). In certain embodiments of the present invention, the first dielectric material disposed on a surface of the substrate above at least one of the at least two source/drain regions is preferably a high density plasma dielectric material or any other dielectric material capable of completely filling small (e.g., sub-micron) spaces with a minimum occurrence of voids, and more preferably, no voids. Preferably, the first dielectric material comprises a high density plasma oxide. In the most preferred embodiments of the present invention, the high density plasma dielectric material will comprise silicon dioxide.

In certain preferred embodiments of the present invention, the memory cells can have a first dielectric material, or more preferably a high density plasma dielectric material, disposed on the surface of the substrate above each of the source/drain regions. In certain preferred embodiments of the present invention, a memory cell can further comprise a gate oxide layer disposed on the surface of the silicon substrate below the dielectric material(s) and the charge-trapping structure(s). The gate oxide layer can be grown thermally on the surface of the substrate, and in preferred embodiments wherein the substrate comprises silicon, the gate oxide may suitably comprise silicon dioxide.

Each pair of source/drain regions in accordance with the present invention is separated by a channel region. The channel region refers to the space within the substrate between the two source/drain regions in which charge carriers migrate from one source/drain region to the other source/drain region when appropriate voltage potentials are applied to the source, drain and gates. As used herein, "channel length" refers to the distance from one source/drain region to the other source/drain region across the channel region. "Channel width" refers to the measurement of the channel region in the direction perpendicular to the channel length.

The memory cells according to the present invention also comprise a charge-trapping structure disposed above the channel region. As used herein, "above the channel region" refers to the spatial placement of the charge-trapping structure on or over, but not necessarily in direct contact with, the channel region portion of the substrate surface. For example, a memory cell in accordance with the present invention may comprise one or more additional layers of material such as a gate oxide layer between the substrate surface and the charge-trapping structure. Thus, a charge-trapping structure in accordance with the present invention may be disposed on the substrate surface directly above the channel region, or it may be separated from the channel region by additional material including, for example, a gate oxide layer.

As used herein, a "charge-trapping structure" refers to a material, layer or multi-layer structure which is capable of trapping localized charge, wherein localization refers to trapped charge carriers that exhibit little, if any, lateral movement within the trapping material. Charge-trapping structures in accordance with the present invention preferably comprise a multi-layer structure including a bottom insulating layer, a charge-trapping layer, and preferably, a top insulating layer. The charge-trapping layer may be any dielectric layer or layers that are capable of or facilitate charge carrier trapping. Accordingly, to facilitate charge carrier trapping, the charge-trapping layer generally comprises a material with a lower electron barrier height than the layers sandwiching it (i.e., two layers with relatively higher barrier heights sandwiching a layer of material with a relatively lower barrier height). For example, in the case of an ONO tri-layer charge-trapping structure, the oxide layers have a barrier height of about 3.1 eV whereas the nitride layer has a barrier height of about 2.1 eV. Thus, an electron well is created in the middle layer.

Exemplary preferred charge-trapping structures can thus comprise various multi-layer structures having at least a bottom insulating layer, a charge-trapping layer, and an optional top insulating layer, and optionally additional trapping and/or insulating layers. Various high k-value dielectric materials can be used as a top insulating layer material. Suitable high k-value dielectric materials include, for example, silicon oxide, tantalum oxide, hafnium oxide, zirconium oxide, strontium titanate, barium strontium titanate, aluminum oxide, their silicates and mixtures thereof.

Accordingly, charge-trapping structures suitable for use in the memory cells of the present invention include, but are not limited to, an ONO tri-layer, an oxide/nitride bi-layer dielectric, a nitride/oxide bi-layer dielectric, an ONONO multi-layer, an oxide/tantalum oxide bi-layer dielectric ($SiO_2$/$Ta_2O_5$), an oxide/tantalum oxide/oxide tri-layer dielectric ($SiO_2$/$Ta_2O_5$/$SiO_2$), an oxide/strontium titanate bi-layer dielectric ($SiO_2$/$SrTiO_3$), an oxide/barium strontium titanate bi-layer dielectric ($SiO_2$/$BaSrTiO_2$), an oxide/strontium titanate/oxide tri-layer dielectric ($SiO_2$/$SrTiO_3$/$SiO_2$), an oxide/strontium titanate/barium strontium titanate tri-layer dielectric ($SiO_2$/$SrTiO_3$/$BaSrTiO_2$), an oxide/hafnium oxide/oxide tri-layer dielectric, and the like (in each case, the first layer mentioned is the bottom layer while the last layer mentioned is the top layer). The charge-trapping layer may also comprise a layer of silicon dioxide having two separate islands of polycrystalline silicon, optionally sandwiched between two additional layers of silicon dioxide.

In certain preferred embodiments of the present invention, the charge-trapping structure comprises an ONO tri-layer (oxide layer-nitride layer-oxide layer), and even more preferably silicon dioxide/silicon nitride/silicon dioxide. In those embodiments of the present invention where the charge-trapping structure comprises two discrete charge-trapping regions separated by a second nanospace, each charge-trapping region can preferably comprise an ONO tri-layer. The bottom oxide layer of ONO charge-trapping layers in accordance with preferred embodiments of the present invention can have a thickness of about 3 to about 7 nanometers. The middle nitride layer of ONO charge-trapping layers in accordance with preferred embodiments of the present invention can have a thickness of about 3 to about 10 nanometers. The top oxide layer of ONO charge-trapping layers in accordance with preferred embodiments of the present invention can have a thickness of about 3 to about 15 nanometers. Most preferably, an ONO tri-layer comprises a bottom oxide layer having a thickness of about 5 to about 6 nanometers, a middle nitride layer having a thickness of about 5 to about 7 nanometers, and a top oxide layer having a thickness of about 6 to about 9 nanometers.

In those preferred embodiments where the charge-trapping structure comprises $SiO_2$/$Si_3N_4$/$SiO_2$, one or both of the silicon dioxide layers may be a silicon-rich silicon dioxide layer. One or both of the silicon dioxide layers may also be an oxygen-rich silicon dioxide layer. One or both of the silicon dioxide layers may be a thermally grown or a deposited oxide. One or both of the silicon dioxide layers may be nitrided oxide layers. The nitride may be a silicon-rich silicon nitride layer or a silicon nitride containing oxygen. The nitride may also be an nitrogen-rich silicon nitride layer.

Memory cells in accordance with the present invention comprise a first gate and a second gate separated by a first nanospace. Both the first gate and the second gate in memory cells in accordance with the present invention are disposed above the charge-trapping structure. As used herein, "above the charge-trapping structure" refers to spatial placement of the gates on, or over, but not necessarily in direct contact with, the upper surface of the charge-trapping structure. Accordingly, gates in memory cells of the present invention may be disposed directly on the uppermost layer of a charge-trapping structure, or they may be separated from the charge-trapping structure by an additional material such as, for example, an additional insulating material. Preferably, in those embodiments of the present invention where the charge-trapping structure comprises a multi-layer structure having an upper insulating layer, the gates are disposed directly on the upper surface of the upper insulating layer.

In the memory cells of the present invention, a first gate is proximate to one of the source/drain regions and a second gate is proximate to another source/drain region. As used herein, "proximate" refers to a gate being situated above the charge-trapping structure in a position closer to its associated source/drain region than the other gate, but does not imply that the entire gate must be closer to its associated source/drain region than every portion of the other gate or that the gate is immediately next to the associated source/drain region. For example, referring to FIG. 1, first nanospace 62, though preferably planar and preferably on a plane perpendicular to the substrate surface and bisecting the channel region 32, may be disposed at a non-perpendicular angle and/or may be positioned such that it does not bisect the channel region across the entire length of the first nanospace, where nanospace length is measured across the channel width (i.e., in the direction perpendicular to the cross-sectional plane of FIG. 1). In such instances, where first nanospace 62 does not bisect the channel region 32 across the entire length of the nanospace, gate 52 can be wider at one edge than the other and gate 54 can be wider at its edge which is directly across the nanospace from the thinner edge of gate 52, and yet gate 52 is still proximate to source/drain region 22 and gate 54 is still proximate to source/drain region 24. In other words, a gate is proximate to a source/drain region where a majority of the gate is closer to its associated source/drain region than the majority of the other gate.

Gates in accordance with the present invention can comprise any conductive material. Gates in accordance with the present invention preferably comprises a polycrystalline silicon layer (also referred to herein as "polysilicon"), which may be either n-type or p-type doped, and a metal silicide layer disposed above the polycrystalline silicon layer. The polycrystalline silicon layer thickness is preferably about 30 nanometers to about 200 nanometers. In certain more preferred embodiments of the present invention, the polycrystalline silicon is n-type doped. The metal silicide gate layer in accordance with preferred embodiments of the present invention can comprise a metal silicide material selected from tungsten silicide, titanium silicide, cobalt silicide, and nickel silicide. The metal silicide thickness is preferably about 30 nanometers to about 100 nanometers.

In certain embodiments of the present invention, a portion of a gate can be disposed above the optional first dielectric material. In such embodiments of the present invention, and where the gate comprises a polysilicon layer and a metal-containing layer disposed above the polysilicon layer, either a portion of the metal-containing layer alone, or a portion of the polysilicon layer and a portion of the metal-containing layer together, can be disposed above the first dielectric material. For example, referring to FIG. 1, a portion of the polycrystalline silicon layer and a portion of the metal-containing layer of one or more of gates 52, 54 and 56, can be disposed above the first dielectric material 72, 74, 76. Alternatively, the polycrystalline silicon layer portion of one or more of gates 52, 54 and 56 can be disposed entirely between the first dielectric materials 72, 74 and 76, and the metal-containing layer can comprise the entire portion of the gates about the first dielectric material 72, 74 and 76.

In certain other embodiments of the present invention, the optional first dielectric material can have a thickness greater than the combined thickness of the charge-trapping structure and gate to which the dielectric material is proximate. For example, referring to FIG. 5, which is also referred to below in more detail, a first dielectric material 576 having a thickness 520, which is greater than the combined thickness of the charge-trapping structure 544 and the gate 558 to which it is proximate, can be disposed above source/drain region 526. Additionally, in such embodiments, a second dielectric material can be disposed above the first gate and/or the second gate. For example, referring again to FIG. 5, a second dielectric material 582, 584, 586, 588 may be disposed above one or more or, preferably, each of the gates. The second dielectric material may be comprised of any suitable dielectric material as discussed above in reference to the first dielectric material. The second dielectric material can preferably comprise an oxide. The first dielectric material and the second dielectric material may be the same or different. In certain preferred embodiments in accordance with this aspect of the invention, a first dielectric material can be disposed above each source/drain region, wherein each first dielectric material has a thickness greater than the combined thickness of the charge-trapping structure and gate to which the first dielectric material is proximate, and a second dielectric material is disposed above each of the gates.

A first gate and a second gate in memory cells of the present invention are separated by a first nanospace. Certain embodiments of memory cells in accordance with the present invention may include charge-trapping structures comprised of two discrete charge-trapping regions separated by a second nanospace. Memory arrays comprising a plurality of memory cells in accordance with the present invention may include a third nanospace separating two adjacent gates of two adjacent memory cells.

In certain embodiments of the present invention, the charge-trapping structure may comprise two discrete charge-trapping regions separated by a second nanospace. In such embodiments, each of the two discrete charge-trapping regions comprises a separate charge-trapping structure as described above. One of the discrete charge-trapping regions is proximate to (i.e., closer to) one of the source/drain regions of the memory cell, and the other discrete charge-trapping region is proximate to, or closer to, another source/drain region of the memory cell. The two discrete charge-trapping regions are separated by a second nanospace which may preferably have a width equal to the first nanospace and is further preferably horizontally aligned below the first nanospace. Accordingly, in various embodiments of the present invention, a second nanospace having a width similar, or equal, to the width of the first nanospace can be horizontally aligned below the first nanospace. For example, referring to FIG. 2, second nanospaces 266, 268 are equal in width to, and horizontally aligned below, first nanospaces 262, 264. Second nanospaces 266, 268 separate discrete charge-trapping regions 242, 244, 246 and 248, which are depicted in FIG. 2 as optionally preferable ONO tri-layers.

Figure 3:
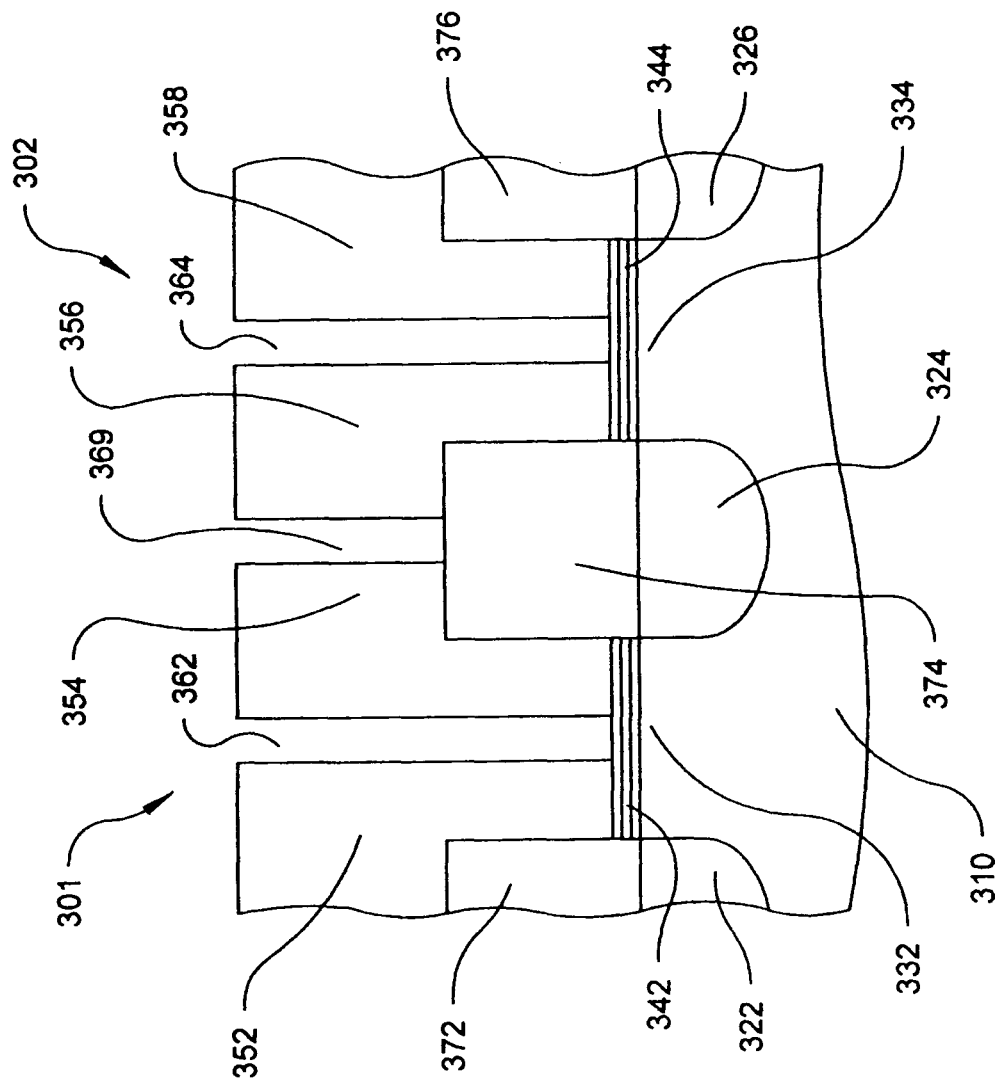
FIG. 3 is a cross-sectional schematic representation of two adjacent memory cells in accordance with another embodiment of the present invention.

In certain embodiments of the present invention, a gate shared by two adjacent memory cells, such as, for example, gate 254 in FIG. 2 which is shared by memory cells 201, 202, can comprise two gates separated by a third nanospace, such as, for example, gates 354, 356 which are separated by third nanospace 369, as shown in FIG. 3, which is referred to below in more detail.

In each instance, the term "nanospace" refers to a void which separates two structures such that at their closest point the two structures are at least electrically separated (or are electrically separable as described below) and such that at their closest point they are separated by a distance no greater than about 60 nm. As used herein, "electrically separable" refers to a nanospace narrow enough for charge tunneling to occur absent insertion of a dielectric material in the nanospace, but which nanospace is capable of being filled with a dielectric material to render the structures separated by the nanospace electrically isolated from one another.

For example, in an embodiment of the present invention where the channel length of the cell (i.e., distance from source to drain) is about 65 to about 300 nanometers, the minimum width of a nanospace in accordance with the present invention (i.e., minimum separation) is preferably at least about 8 nanometers, more preferably at least about 20 nanometers and most preferably at least about 30 nanometers. Nanospaces in accordance with such embodiments of the present invention preferably have a maximum width at their narrowest point of no greater than about 60 nanometers, more preferably no greater than about 45 nanometers and most preferably no greater than about 40 nanometers. Preferred nanospace width ranges can vary in relation to the technology node or generation of the memory cell. Accordingly, while the preferred ranges set forth above are described in reference to a memory cell having a channel length of about 65 to 300 nanometers, preferred ranges for any channel length are determinable by simple mathematical ratio calculations.

Figure 9A:
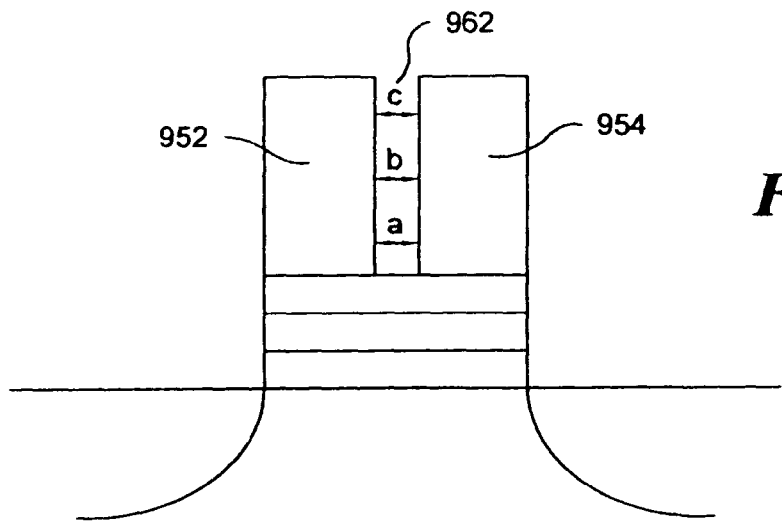
FIG. 9a is a cross-sectional schematic representation of a memory cell in accordance with an embodiment of the present invention, depicting nanospace width aspects.

Nanospaces in accordance with the present invention preferably have a generally constant width across the entire nanospace, but the width may vary from one point in a particular nanospace to another. Nanospace width may vary slightly from top to bottom and along the length of the nanospace due to ordinary etching irregularities. Referring to FIG. 9a, a cross-sectional schematic representation of a memory cell in accordance with one embodiment of the present invention is shown with a nanospace 962 separating gates 952, 954, and having a generally constant width across the entire nanospace. As used herein, a "generally constant width" refers to nanospaces wherein width measurements at various points across the nanospace, for example widths a, b and c shown in FIG. 9a, are approximately equal, i.e. (a≈b≈c). More specifically, generally constant width refers to nanospaces having width measurements within +/−10% of one another across 90% or more of the nanospace.

Figure 9B:
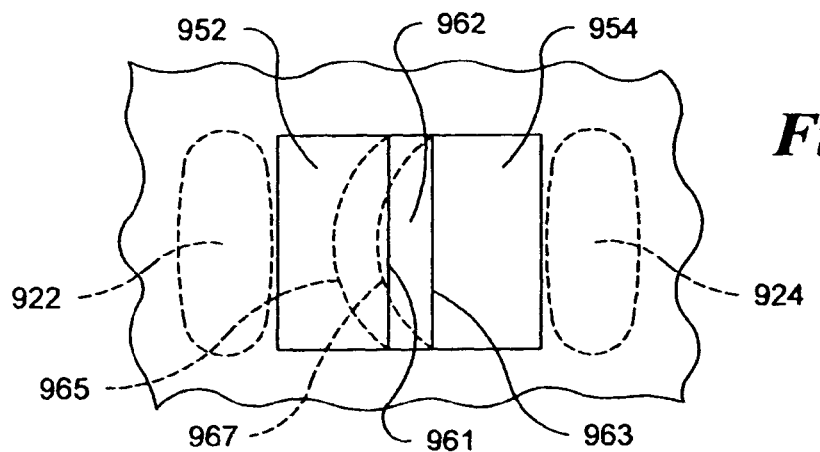
FIG. 9b is a plan view of a memory cell in accordance with an embodiment of the present invention; depicting nanospace layout aspects.

Nanospaces in accordance with the present invention are preferably substantially straight. As used herein, "substantially straight" refers to a straight line orientation of a nanospace having no angle or curve greater than 15° in either direction measured from one end to the other when viewed from above the memory cell. Referring to FIG. 9b, a plan view of a memory cell in accordance with one embodiment of the present invention is shown. Gates 952 and 954, which are proximate to source/drain regions 922 and 924, respectively, are separated by a nanospace 962. Nanospace 962 is shown with edges 961, 963 as being substantially straight. Broken lines 965, 967 show a curved, or not substantially straight nanospace.

Figure 9C:
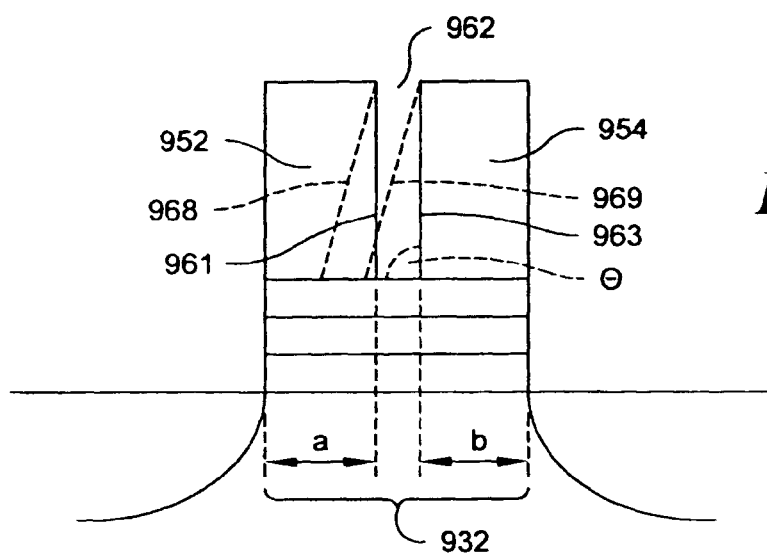
FIG. 9c is a cross-sectional schematic representation of a memory cell in accordance with an embodiment of the present invention, depicting nanospace spatial positioning.

Nanospaces in accordance with the present invention preferably extend in a planar direction normal to the substrate surface, and also preferably bisect the channel region. Accordingly, while a nanospace of the present invention may be positioned such that the top of the nanospace is closer to a structure (i.e., gate or charge-trapping region) than the bottom of the nanospace, or vice versa, it is preferred that the nanospace extend in a generally normal direction from the substrate surface. As used herein, "a normal direction" does not mean absolutely perpendicular, but rather, within +/−15° of true normal in either direction. Referring to FIG. 9c, a cross-sectional representation of a memory cell in accordance with one embodiment of the present invention is shown having gates 952 and 954 which are separated by nanospace 962. Edges 961, 963 are shown as being essentially normal to the plane of the substrate surface, i.e., the angle θ equals 90°+/−15°. While nanospaces in accordance with the present invention are preferably normal to the substrate surface, nanospaces can be disposed at various angles as shown by broken lines 968, 969.

First and/or second nanospaces in accordance with the present invention also preferably bisect the space above the channel region of the memory cell. Thus, in such preferred embodiments, the first and/or second nanospaces are positioned such that the bottom of the nanospace is equidistant from both the source region and the drain region along the length of the nanospace. As used herein, the length of the nanospace refers to the dimension of the nanospace across the width of the channel region. In general, the bottom of a first or second nanospace in accordance with the present invention can be positioned relative to the source and drain of the memory cell in any manner such that the nanospace traverses the entire width of the channel. In other words, the bottom of the nanospace can be closer to the source than the drain, or vice versa, and may be positioned at an angle such that one end of the bottom of the nanospace is closer to a source/drain region than the other end. As used herein, in reference to certain preferred embodiments wherein the bottom of the nanospace bisects the space above the channel region, "equidistant" means the distances from the source region and drain region to the bottom of the nanospace along the entire length of the bottom of the nanospace are within +/−10% of one another. Referring to FIG. 9c, a nanospace 962 bisecting the channel region 932 is shown being represented by edges 961, 963 of gates 952, 954 such that distance a is approximately equal to distance b along the length of the base of the nanospace, i.e., a≈b, where approximately means +/−10%. Third nanospaces in accordance with the present invention preferably bisect the source/drain region shared by the adjacent memory cells.

In certain embodiments of the present invention, any or all of the nanospaces can be at least partially, or preferably completely, filled with a spacer dielectric material. Thus, a first nanospace may be partially, or completely filled with a spacer dielectric material, or a first and/or second nanospace may be partially or completely filled with a spacer dielectric material, or a first, second and/or third nanospace may be partially or completely filled with a spacer dielectric material. Any dielectric material suitable for use as the first or second dielectric material above can be used as one or more of the spacer dielectric materials. Each of the spacer dielectric materials may be the same or different, and may further be the same as or different from either the first dielectric material or the second dielectric material as discussed above.

Referring to FIGS. 1 and 3, FIG. 3 illustrates two adjacent non-volatile memory cells 301, 302 in accordance with another embodiment of the present invention. The two memory cells 301, 302 can be part of a memory array comprising numerous memory cells. The individual memory cells can be graphically segregated by a vertical dashed line such as that shown in FIGS. 1 and 2, but which is not shown in FIG. 3 or the remainder of the Figures to reduce the number of markings in the Figures. In structural similarity to the embodiment shown in FIG. 1, each of the two memory cells depicted in FIG. 3 comprises a semiconductor substrate 310 having two source/drain regions 322, 324, 326. Each memory cell has a channel region 332, 334 situated between the memory cell's source/drain regions 322, 324, 326. Each memory cell comprises a charge-trapping structure 342, 344 disposed above the channel regions 332, 334. In certain preferred embodiments according to the present invention, the charge-trapping structure can comprise an ONO tri-layer. In FIG. 3, charge-trapping structures 342, 344 are depicted as ONO tri-layers. As shown in FIG. 3, the memory cell may optionally also comprise a first dielectric material 372, 374, 376 disposed above one or more or, in certain preferred embodiments, each of the source/drain regions 322, 324, 326. In the embodiment of the present invention depicted in FIG. 3, each memory cell comprises two gates. Thus, for example, memory cell 301 includes a first gate 352 and a second gate 354, and memory cell 302 includes a first gate 356 and a second gate 358. As mentioned above, in any embodiment of the present invention, a gate may preferably comprise a lower layer of polycrystalline silicon and an upper layer of a metal-containing material such as, for example, a metal silicide. In each memory cell, the two gates are separated by a first nanospace 362, 364. In the embodiment of the present invention depicted in FIG. 3, the adjacent gates 354 and 356 of memory cells 301 and 302 are separated by a third nanospace 369.

Figure 4:
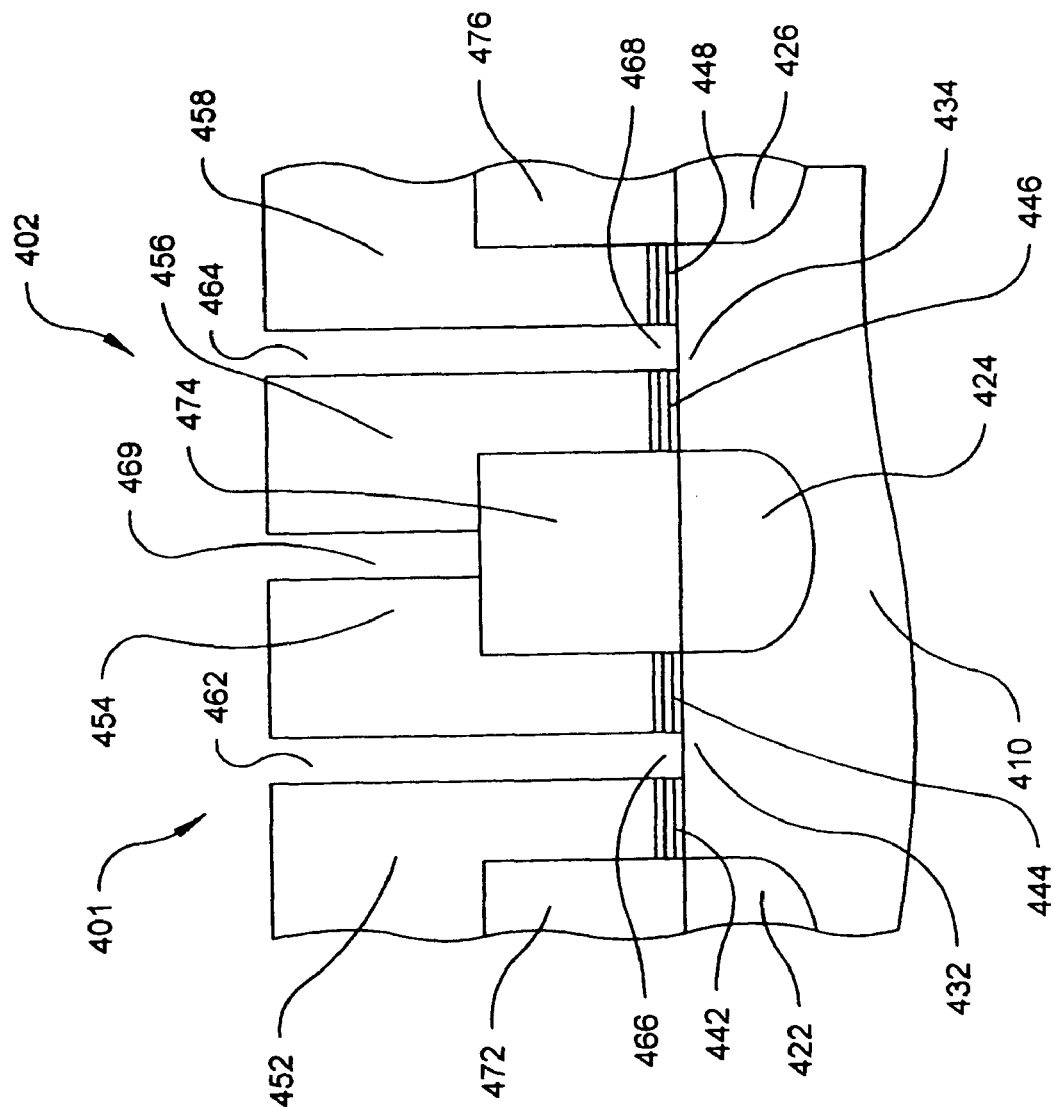
FIG. 4 is a cross-sectional schematic representation of two adjacent memory cells in accordance with another embodiment of the present invention.

Referring to FIGS. 2 and 4, FIG. 4 illustrates a two adjacent non-volatile memory cells 401, 402 in accordance with another embodiment of the present invention. The two memory cells 401, 402 can be part of a memory array comprising numerous memory cells. In structural similarity to the embodiment shown in FIG. 2, each of the two memory cells depicted in FIG. 4 comprises a semiconductor substrate 410 having two source/drain regions 422, 424, 426. Each memory cell has a channel region 432, 434 situated between the memory cell's source/drain regions 422, 424, 426. In the embodiment of the present invention depicted in FIG. 4, a charge-trapping structure can comprise two discrete charge-trapping regions. For example, charge-trapping regions 442, 444, disposed above the channel region 432, are separated by a second nanospace 466 in memory cell 401, and two discrete charge-trapping regions 446, 448, disposed above the channel region 434, are separated by a second nanospace 468 in memory cell 402. In FIG. 4, charge-trapping regions 442, 444, 446, 448 are depicted as optionally preferable ONO tri-layers. As shown in FIG. 4, the memory cell may optionally also comprise a first dielectric material 472, 474, 476 disposed above one or more or, in certain preferred embodiments, each of the source/drain regions 422, 424, 426. In the embodiment of the present invention depicted in FIG. 4, each memory cell comprises two gates. Thus, for example, memory cell 401 includes a first gate 452 and a second gate 454, and memory cell 402 includes a first gate 456 and a second gate 458. In each memory cell, the two gates are separated by a first nanospace 462, 464. In the embodiment of the present invention depicted in FIG. 4, the adjacent gates 454 and 456 of memory cells 401 and 402 are separated by a third nanospace 469.

Figure 5:
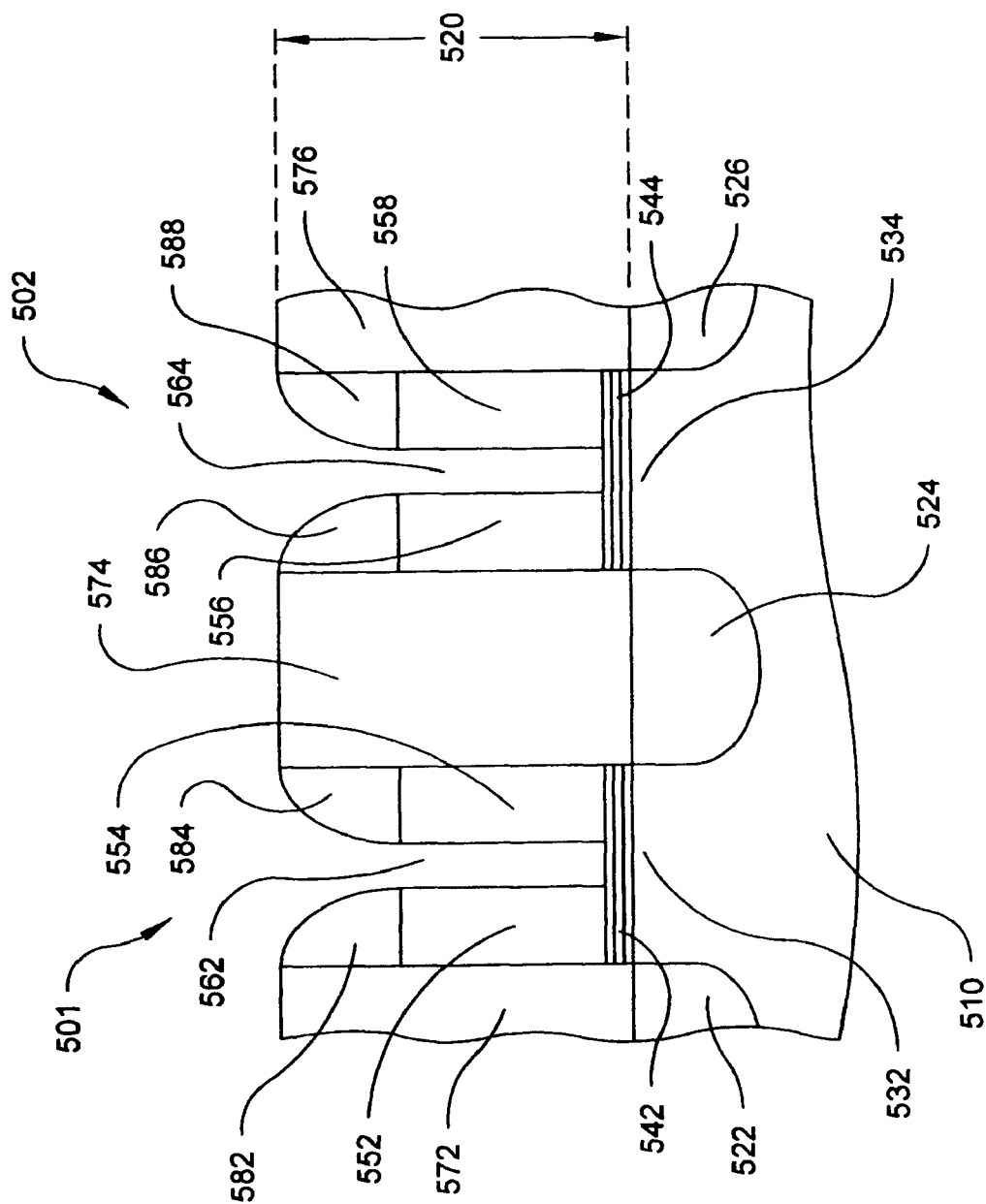
FIG. 5 is a cross-sectional schematic representation of two adjacent memory cells in accordance with another embodiment of the present invention.

FIG. 5 illustrates two adjacent non-volatile memory cells 501, 502 in accordance with another embodiment of the present invention. The two memory cells 501, 502 can be part of a memory array comprising numerous memory cells. Each of the two memory cells depicted in FIG. 5 comprises a semiconductor substrate 510 having two source/drain regions 522, 524, 526. Each memory cell has a channel region 532, 534 situated between the memory cell's source/drain regions 522, 524, 526. Each memory cell comprises a charge-trapping structure 542, 544 disposed above the channel regions 532, 534. In FIG. 5, charge-trapping structures 542, 544 are depicted as optionally preferable ONO tri-layers. Each memory cell comprises two gates. Thus, for example, memory cell 501 includes a first gate 552 and a second gate 554, and memory cell 502 includes a first gate 556 and a second gate 558. In each memory cell, the two gates are separated by a first nanospace 562, 564. In the embodiment of the present invention depicted in FIG. 5, the memory cells also comprise a first dielectric material 572, 574, 576 disposed above at least one, and preferably all, of the source/drain regions 522, 524, 526. In the embodiment shown in FIG. 5, the first dielectric material 572, 574, 576 has a thickness 520 which is greater than the combined thickness of the charge-trapping structure 542 or 544 and the gate to which the dielectric material is proximate. Thus, for example in FIG. 5, first dielectric material 576 has a thickness 520 which is greater than the combined thickness of charge-trapping structure 544 and gate 558. Memory cells in accordance with this embodiment of the present invention further comprise a second dielectric material 582, 584, 586, 588 disposed above the gates 552, 554, 556, 558.

Figure 6:
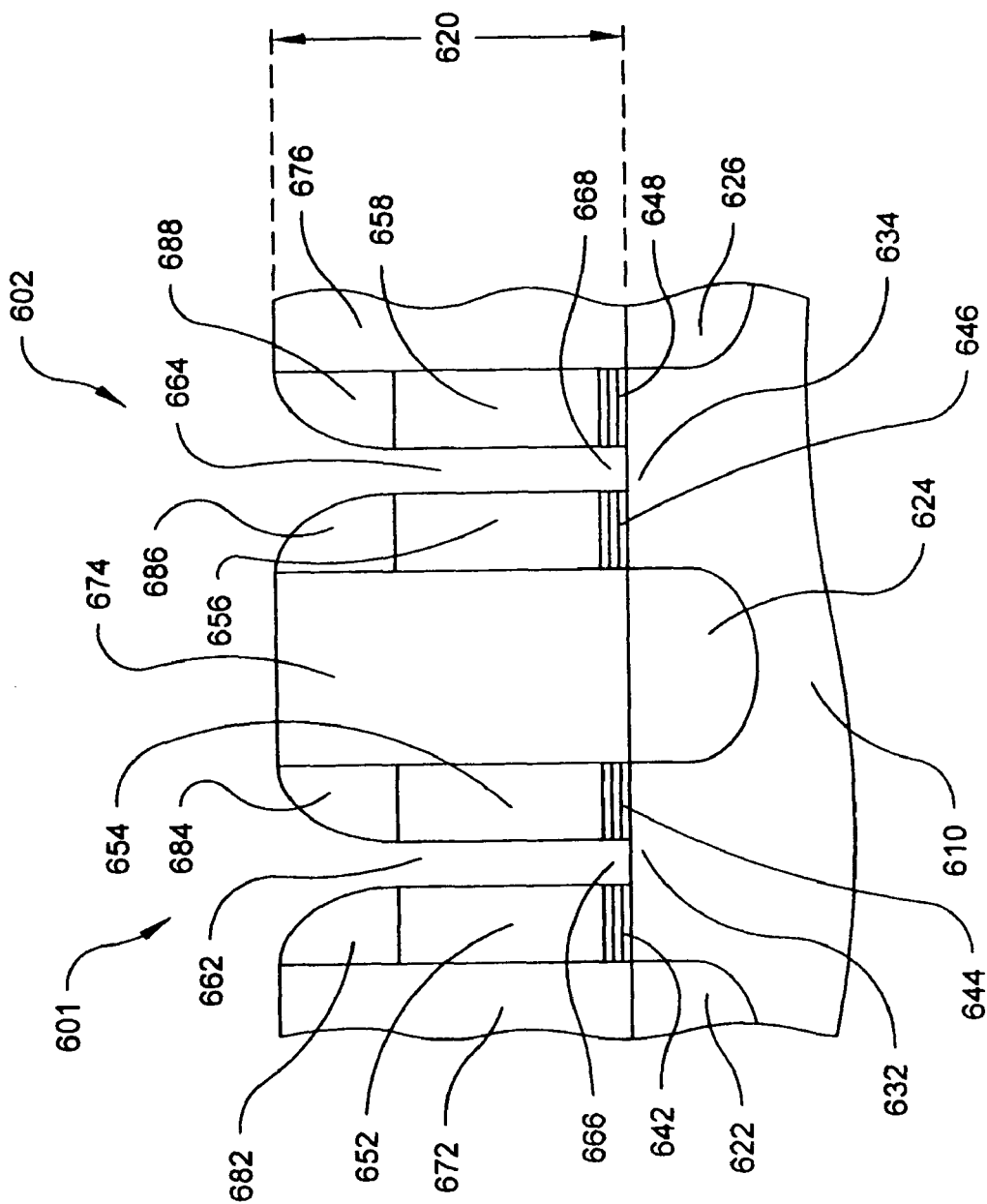
FIG. 6 is a cross-sectional schematic representation of two adjacent memory cells in accordance with another embodiment of the present invention.

Referring to FIGS. 5 and 6, FIG. 6 illustrates two adjacent non-volatile memory cells 601, 602 in accordance with another embodiment of the present invention. The two memory cells 601, 602 can be part of a memory array comprising numerous memory cells. In structural similarity to the embodiment shown in FIG. 5, each of the two memory cells depicted in FIG. 6 comprises a semiconductor substrate 610 having two source/drain regions 622, 624, 626. Each memory cell has a channel region 632, 634 situated between the memory cell's source/drain regions 622, 624, 626. In the embodiment of the present invention depicted in FIG. 6, a charge-trapping structure can comprise two discrete charge-trapping regions. For example, charge-trapping regions 642, 644, disposed above the channel region 632, separated by a second nanospace 666 in memory cell 601, and two discrete charge-trapping regions 646, 648, disposed above the channel region 634, separated by a second nanospace 668 in memory cell 602. In FIG. 6, charge-trapping regions 642, 644, 646, 648 are depicted as optionally preferable ONO tri-layers. Each memory cell comprises two gates. Thus, for example, memory cell 601 includes a first gate 652 and a second gate 654, and memory cell 602 includes a first gate 656 and a second gate 658. In each memory cell, the two gates are separated by a first nanospace 662, 664. In structural similarity to the embodiment shown in FIG. 5, the memory cells depicted in FIG. 6 also comprise a first dielectric material 672, 674, 676 disposed above at least one, and preferably all, of the source/drain regions 622, 624, 626, wherein the first dielectric material 672, 674, 676 has a thickness 620 which is greater than the combined thickness of the charge-trapping structure 642 or 644 and the gate to which the first dielectric material is proximate. Memory cells in accordance with this embodiment of the present invention further comprise a second dielectric material 682, 684, 686, 688 disposed above the gates 652, 654, 656, 658.

Figure 7:
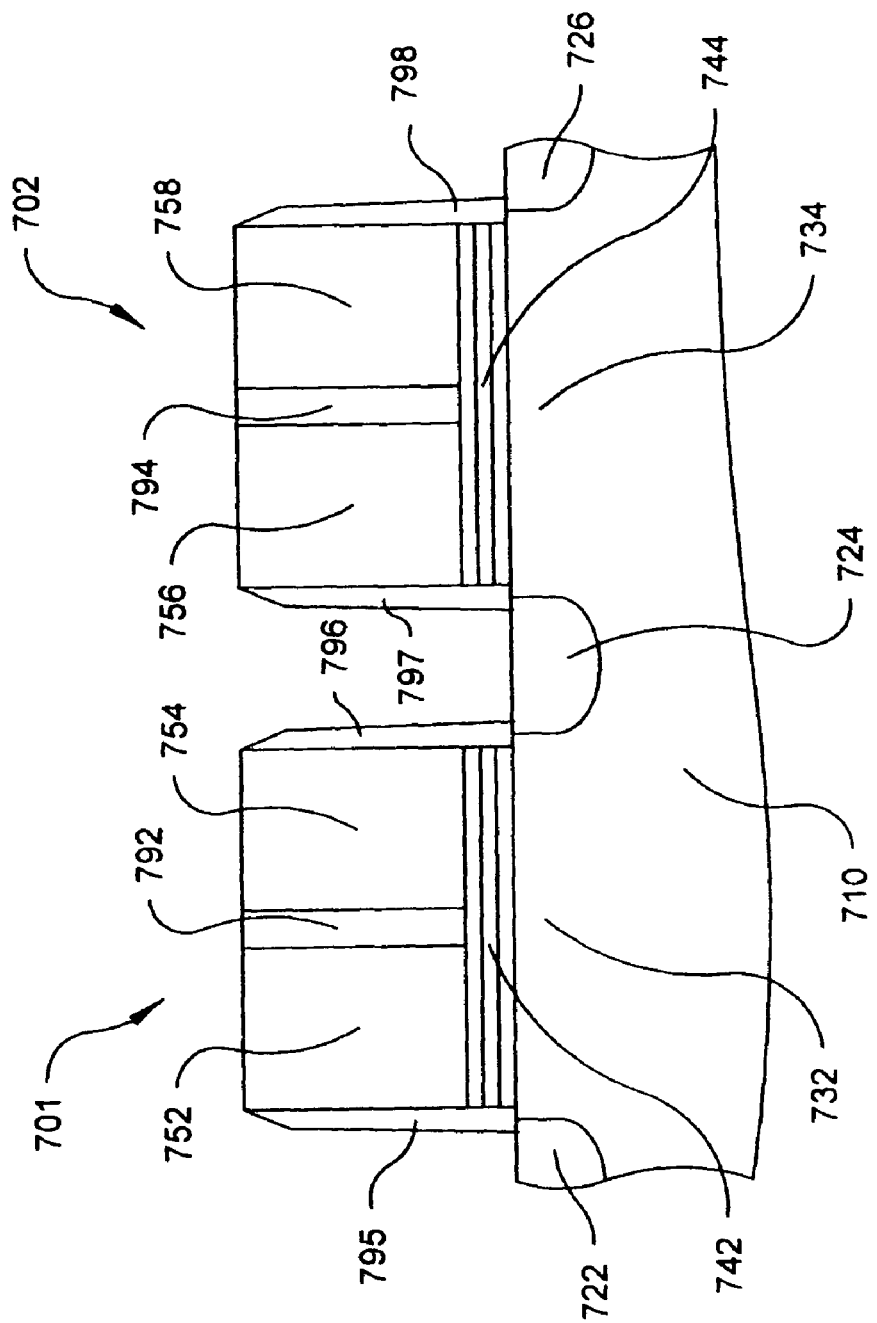
FIG. 7 is a cross-sectional schematic representation of two adjacent memory cells in accordance with another embodiment of the present invention.

FIG. 7 illustrates two adjacent non-volatile memory cells 701, 702 in accordance with another embodiment of the present invention. The two memory cells 701, 702 can be part of a memory array comprising numerous memory cells. Each of the two memory cells depicted in FIG. 7 comprises a semiconductor substrate 710 having two source/drain regions 722, 724, 726. Each memory cell has a channel region 732, 734 situated between the memory cell's source/drain regions 722, 724, 726. Each memory cell comprises a charge-trapping structure 742, 744 disposed above the channel regions 732, 734. In FIG. 7, charge-trapping structures 742, 744 are depicted as ONO tri-layers. Each memory cell comprises two gates 752, 754, 756, 758. For example, memory cell 701 includes a first gate 752 and a second gate 754, and memory cell 702 includes a first gate 756 and a second gate 758. In each memory cell, the two gates are separated by a first nanospace which is at least partially, and preferably (as shown in FIG. 7) completely filled with a spacer dielectric material 792, 794. Additionally, the sides of the gates 752, 754, 756, 758 which are proximate to the source/drain regions 722, 724, 726 are at least partially, and preferably completely, covered with a spacer dielectric material 795, 796, 797, 798.

Figure 8:
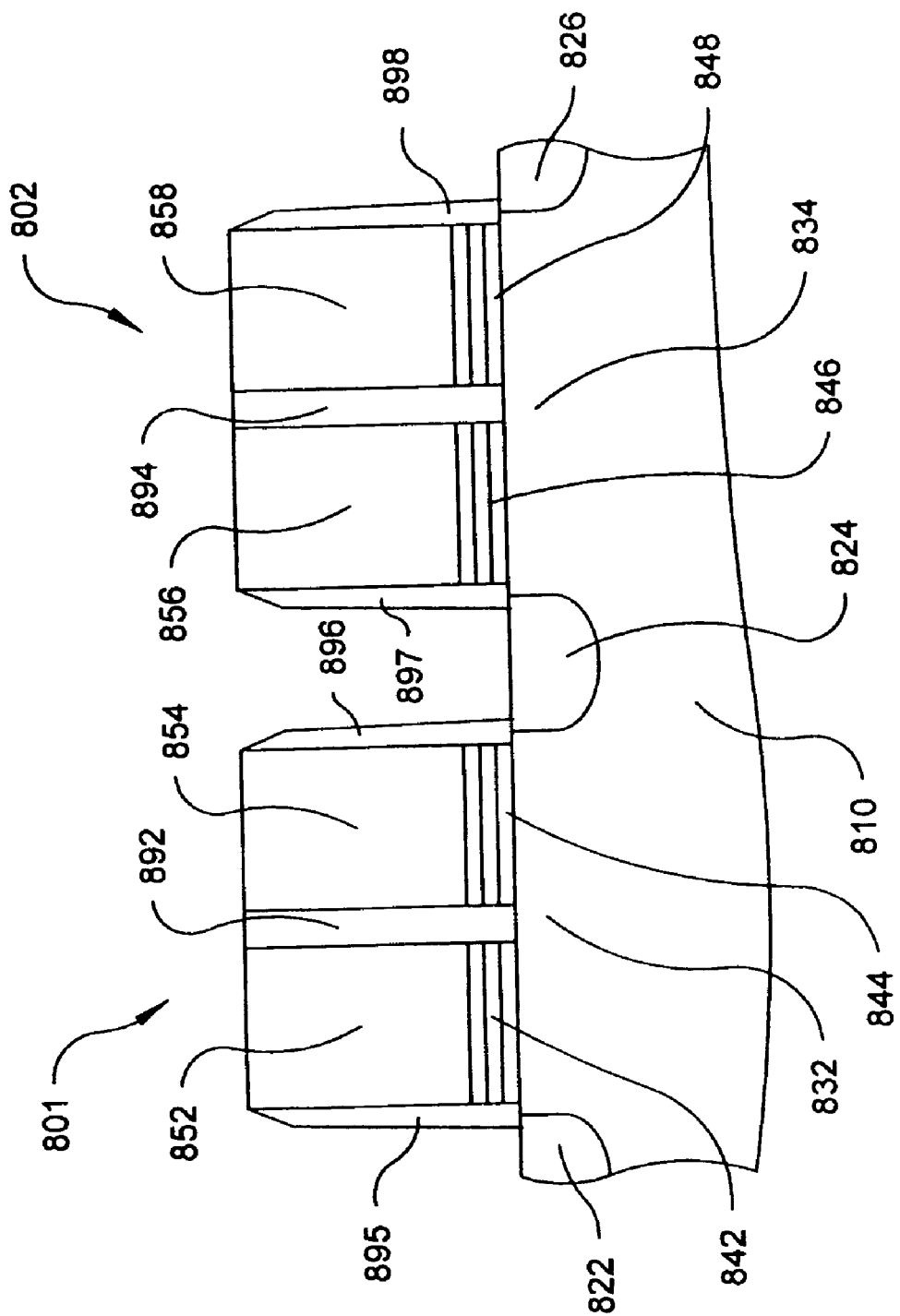
FIG. 8 is a cross-sectional schematic representation of two adjacent memory cells in accordance with another embodiment of the present invention.

Referring to FIGS. 7 and 8, FIG. 8 illustrates two adjacent non-volatile memory cells 801, 802 in accordance with another embodiment of the present invention. The two memory cells 801, 802 can be part of a memory array comprising numerous memory cells. Each of the two memory cells depicted in FIG. 8 comprises a semiconductor substrate 810 having two source/drain regions 822, 824, 826. Each memory cell has a channel region 832, 834 situated between the memory cell's source/drain regions 822, 824, 826. In the embodiment of the present invention depicted in FIG. 8, a charge-trapping structure can comprise two discrete charge-trapping regions. For example, charge-trapping regions 842, 844, disposed above the channel region 832, are separated by a second nanospace in memory cell 801, and two discrete charge-trapping regions 846, 848, disposed above the channel region 834, are separated by a second nanospace in memory cell 802. In FIG. 8, charge-trapping regions 842, 844, 846, 848 are depicted as optionally preferable ONO tri-layers. Each memory cell comprises two gates 852, 854, 856, 858. For example, memory cell 801 includes a first gate 852 and a second gate 854, and memory cell 802 includes a first gate 856 and a second gate 858. In each memory cell, the two gates are separated by a first nanospace which, in addition to the second nanospaces in each of the cells, is at least partially, and preferably (as shown in FIG. 8) completely filled with a spacer dielectric material 892, 894. Additionally, the sides of the gates 852, 854, 856, 858 which are proximate to the source/drain regions 822, 824, 826 are at least partially, and preferably completely, covered with a spacer dielectric material 895, 896, 897, 898.

The present invention also includes methods of manufacturing non-volatile memory cells having at least two gates separated by a first nanospace above the channel region of the cell and arrays comprising a plurality of such non-volatile memory cells.

One embodiment of a method of manufacturing memory cells in accordance with the present invention includes providing a semiconductor substrate having: a source region and a drain region separated by a channel region; a charge-trapping structure disposed above the channel region of the semiconductor substrate; and a gate material disposed above the charge-trapping structure.

Any material described above as suitable for use as a semiconductor substrate in memory cells according to the present invention may be employed in the methods of the present invention. Accordingly, for example, a silicon wafer may be used as the semiconductor substrate. The source and drain regions may be formed in the substrate in any suitable manner, as described above, including, for example, via ion implantation. The charge-trapping structure provided on the semiconductor substrate may be any charge-trapping structure described above as suitable for use in the memory cells of the present invention. For example, in preferred embodiments, the charge-trapping structure can be provided as an ONO tri-layer. The gate material disposed above the charge-trapping structure on the semiconductor substrate provided in the methods according to the present invention can be any conductive material as described above with respect to the first gate and the second gate. Accordingly, the gate material disposed above the charge-trapping structure may be provided as a layer of polycrystalline silicon below a layer of a metal-containing material. For example, the gate material may comprise a lower layer of n+doped polysilicon and an upper layer of a metal-silicide.

The charge-trapping structure may be formed by any suitable process known or to be developed for the formation or deposition of charge-trapping structure materials. For example, where the charge-trapping structure comprises an oxide layer, the oxide layer may be formed via oxidation techniques including, but not limited to, thermal oxidation, chemical vapor deposition (CVD), low-pressure CVD (LPCVD), plasma-enhanced CVD (PECVD), or high-density plasma CVD (HDPCVD). Suitable processes for the deposition of a nitride layer include, but are not limited to nitridation, chemical vapor deposition and plasma-nitridation. In certain preferred embodiments of the present invention wherein the charge-trapping structure comprises an ONO tri-layer, a bottom silicon dioxide layer can be formed by thermal oxidation of the silicon substrate surface, a middle nitride layer can be formed via chemical vapor deposition of silicon nitride, and more preferably low-pressure chemical vapor deposition, and a top oxide layer can be formed by chemical vapor deposition. A wet-conversion process from silicon nitride to silicon oxide is also a preferred formation method for a top oxide layer.

The gate material layer can be formed by any suitable process for the deposition of a metal, metal-containing material, polycrystalline silicon, or other conductive material. Metals can be deposited using any metallization process known or to be developed. Metal-containing materials such as metal silicides can be deposited, for example, by sputtering, or CVD. CVD processes are preferred for forming metal silicides. Polycrystalline silicon materials can be deposited by any method known or to be developed, such as a CVD process with $SiH_4$ or dicloro-$SiH_4$ and the polycrystalline silicon may be doped during or after deposition on the semiconductor substrate.

After providing a semiconductor substrate having a source, drain, charge-trapping structure and gate material, methods in accordance with this embodiment of the present invention further include forming a patterning layer above the gate material such that a first nanoarea above the channel region is exposed. As used herein, a "nanoarea" refers to the base or footprint of a gap in the patterning layer wherein the nanoarea is sized such that it extends across the entire channel width and itself has a width (as measured in the direction of the channel length), at its narrowest point, which is no greater than about 60 nm. In general, the width of the nanoarea will correspond to the width of the nanospace formed using the gap in the patterning layer. However, the width of the nanoarea can be smaller or larger than the width of the resulting nanospace. For example, etching chemistries and gas mixing ratios can be selected and/or adjusted as appropriate based upon the stack materials to be etched so that the width bias between pre-etch and post-etch is zero, positive, or negative, but the chemistries and mixing ratios are preferably selected so that the bias is essentially zero. A nanoarea preferably has a constant separation width across the entire channel width. A first nanoarea preferably bisects the area above the channel region. A gap in the patterning layer, the footprint of which is a nanoarea, is preferably substantially straight and is preferably formed normal to the semiconductor substrate surface. As used herein in reference to nanoareas and gaps, the terms "constant width", "bisects the area above the channel region", "substantially straight", and "normal" are defined as set forth above in reference to nanospaces in accordance with the invention. In certain embodiments of the invention, the patterning layer may be formed such that a second nanoarea above one or both of the source region and the drain region is exposed in addition to the first nanoarea.

It is to be understood, when referring to a nanoarea exposed "above the channel region" that additional materials or layers of materials may be present between the substrate surface, charge-trapping structure and/or gate material and the patterning layer, including, for example, anti-reflective coatings disposed above the gate material. In certain embodiments, an anti-reflective coating layer can comprise a polymer-based bottom anti-reflective coating or a dielectric anti-reflective coating, such as SiON.

The patterning layer can comprise any material or combination of materials suitable for use as a mask during removal (e.g., etching) of the exposed gate material. As is understood by those of ordinary skill in the art, the selection of a patterning material for masking can depend upon the composition of gate material to be removed and the removal method to be used (e.g., wet or dry etching). For example, where the gate material comprises a tungsten silicide/polysilicon bilayer, and dry etching is used for gate material removal, suitable masking materials include SiON and/or oxide. Patterning layers in accordance with the present invention are formed above the upper surface of the gate material such that a nanoarea above the upper surface is exposed. Accordingly, a patterning layer can comprise a suitable masking material capable of being deposited with a gap providing an exposed nanoarea, or may comprise a deposited material which can be conformally coated with a second masking material to provide an exposed nanoarea.

In certain embodiments, forming the patterning layer comprises depositing two portions of a first material above the upper surface of the gate material where the two portions are separated by a distance, and depositing a conformal layer of a masking material over the two portions of the first material. The deposition of the conformal layer can be carried out such that the side surface of the conformal layer covering one portion of the first material and the nearby side surface of the conformal layer covering the other portion of the first material are separated above the gate material by a nanoarea. As used herein, the "distance" separating the two portions of the first material refers to a gap between the two portions which has a width larger than a nanospace width as defined above in reference to nanospaces according to the present invention.

Exemplary first materials which may be deposited above the gate material can include photoresist compositions and/or dielectric anti-reflective coatings, such as an SiON layer which may optionally be Si-rich or Si-poor. In certain preferred embodiments, the first material comprises a photoresist material. The two portions of the first material can be formed above the gate material in a pattern with a pitch corresponding to the pitch of the bit lines (i.e., source and drain regions), but with separation distances larger than the ultimate nano-separation distances to be provided by the nanospaces. The two portions of the first material can also be formed in a pattern having a pitch one-half of the pitch of the bit lines, but with separation distances larger than the ultimate nano-separation distances to be provided by the nanospaces.

In embodiments where the first material comprises a photoresist material, the distance between the portions can be such that the exposed portion of the gate material is greater than the desired nanoarea as the resolution of photoresist pattern formation is often not sufficient to expose such nanoareas. Subsequent to the formation of the two portions of the first material, e.g., a photoresist pattern, a conformal layer can be deposited over the photoresist material, wherein the conformal nature of the layer allows sufficient control of its dimensions to leave a nanoarea exposed above the gate material. Portions of the conformal layer between the two portions of the first material can be selectively removed, for example, by anisotropic etching.

In certain embodiments, where a plurality of cells comprising an array are provided on the semiconductor substrate for use in methods according to the invention, the patterning layer can be formed such that a second nanoarea is exposed above the source and/or drain region. In those embodiments where a first nanoarea is exposed above the gate material and a second nanospace is exposed above the source region and above the drain region, the pattern of the first material will have a pitch one-half that of the bit lines (i.e., source and drain regions).

The conformal layer can comprise materials which are organic or inorganic, and which can be photo-insensitive. The conformal layer can be deposited using known chemical vapor deposition techniques including, but not limited to, plasma-enhanced chemical vapor deposition (PECVD) and low-pressure chemical vapor deposition (LPCVD). In certain preferred embodiments, the conformal layer comprises a polymer material containing at least one hydrocarbon partially substituted by fluorine. The conformal layer may comprise any of the materials disclosed in, and may be deposited by any of the methods disclosed in U.S. Pat. No. 6,750,150, U.S. Patent Application Pub. No. US2003/0216051, and/or U.S. Patent Application Pub. No. US2003/0224602, the entire contents of each being incorporated herein by reference.

In certain embodiments of the present invention, the semiconductor substrate is provided further comprising a first dielectric material disposed above each of the source/drain regions, the first dielectric materials having thicknesses greater than the combined thickness of the charge-trapping layer and gate material to which they are proximate. In such embodiments, forming the patterning layer can comprise depositing a second dielectric material on each side of the upper surface of the gate material adjacent to the first dielectric materials such that a nanoarea above the gate material is exposed.

The second dielectric material can be deposited by any technique known or to be developed for the deposition of dielectric materials. CVD processes are preferred for forming a second dielectric material. Suitable second dielectric materials are described above in reference to memory cells in accordance with the present invention. Preferably, the second dielectric material comprises silicon nitride or silicon oxynitride.

After forming the patterning layer, methods in accordance with the present invention further include removing the gate material exposed below the nanoarea to form a first gate and a second gate separated by a nanospace. Removal of the gate material (any additional optional materials present above the gate material such as an anti-reflective coating) can be carried out using any removal process known or to be developed including, but not limited to, wet and/or dry etching. Exemplary removal techniques include reactive ion etching and plasma-assisted etching. Preferably, removal is carried out via reactive-ion-etching with chemistries including $Cl_2$ and/or HBr, and/or $O_2$ and/or fluorine.

In certain embodiments of the present invention, removal of the materials exposed below one or more of the nanoareas may be carried out to an extent such that removal is stopped after the gate material is removed and a first gate and second gate are formed. Removal of material below any one or more nanoareas may be carried out to an extent such that removal is stopped after the charge-trapping structure under the nanoarea is removed and two discrete charge-trapping regions are formed.

After the materials exposed below the nanoarea are removed, the patterning layer may optionally be removed by any suitable process including, but not limited to, etching and chemical-mechanical polishing. Subsequent to formation of a nanospace by removal of the materials exposed below the nanoarea, additional semiconductor processing which is known or is to be developed can be carried out to complete the fabrication of an entire integrated circuit or semiconductor device including, for example, the formation of metal contacts, peripheral circuitry, select gates, etc.

Figure 10A:
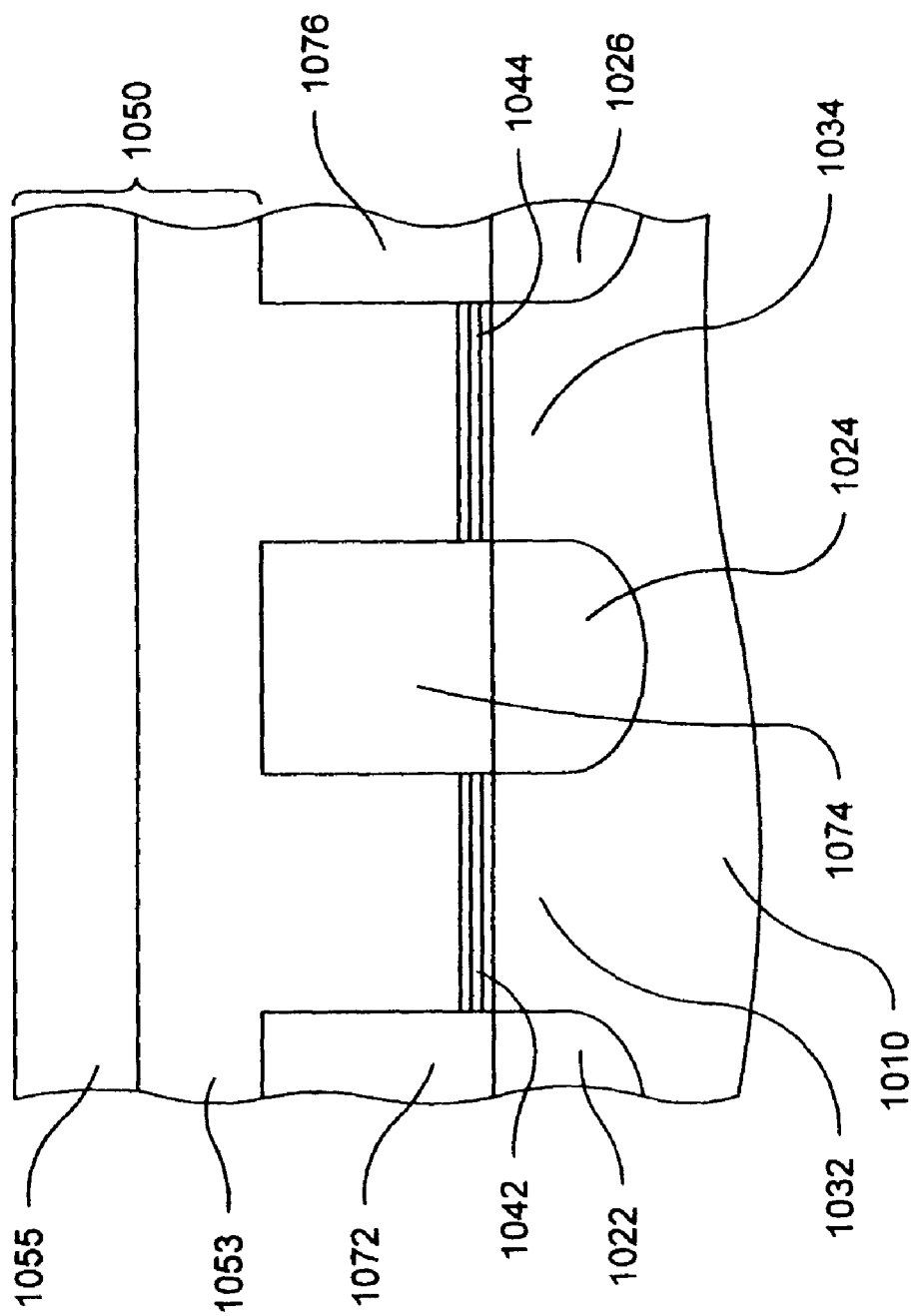
FIGS. 10a-10d are cross-sectional schematic representations illustrating a method of manufacturing in accordance with an embodiment of the present invention at various stages of production.

Referring to FIGS. 10a-10d, a method of manufacturing memory cells in accordance with one embodiment of the present invention is described. In FIG. 10a, a cross-sectional representation of a semiconductor substrate provided in accordance with certain methods of the present invention is shown. Referring to FIG. 10a, a process according to the embodiment depicted in FIGS. 10a-10d includes providing a semiconductor substrate 1010 having a source region and a drain region. In FIG. 10a, a plurality of source/drain regions 1022, 1024, 1026 are shown. The semiconductor substrate includes channel regions separating the source and drain regions. For example, channel region 1032 separates source/drain region 1022 and source/drain region 1024, and channel region 1034 separates source/drain region 1024 and source/drain region 1026. The semiconductor substrate also has charge-trapping structures 1042, 1044 disposed above the channel regions 1032, 1034. In FIG. 10a, charge-trapping structures 1042, 1044 are depicted as optionally preferable ONO tri-layers. A gate material 1050 is provided above the charge-trapping structures 1042, 1044. In the embodiment depicted in FIGS. 10a-10d, the gate material 1050 is shown as an optionally preferable bi-layer structure comprised of a polysilicon layer 1053 below a metal-containing layer 1055. In the embodiment depicted in FIG. 10a, the semiconductor substrate is provided with first dielectric materials 1072, 1074, 1076 disposed above source/drain regions 1022, 1024, 1026, and wherein a portion of the gate material 1050 can be disposed above the first dielectric materials 1072, 1074, 1076. In the embodiment depicted in FIGS. 10a-10d, portions of both the polysilicon layer 1053 and the metal-containing layer 1055 are disposed above the first dielectric materials.

Figure 10B:
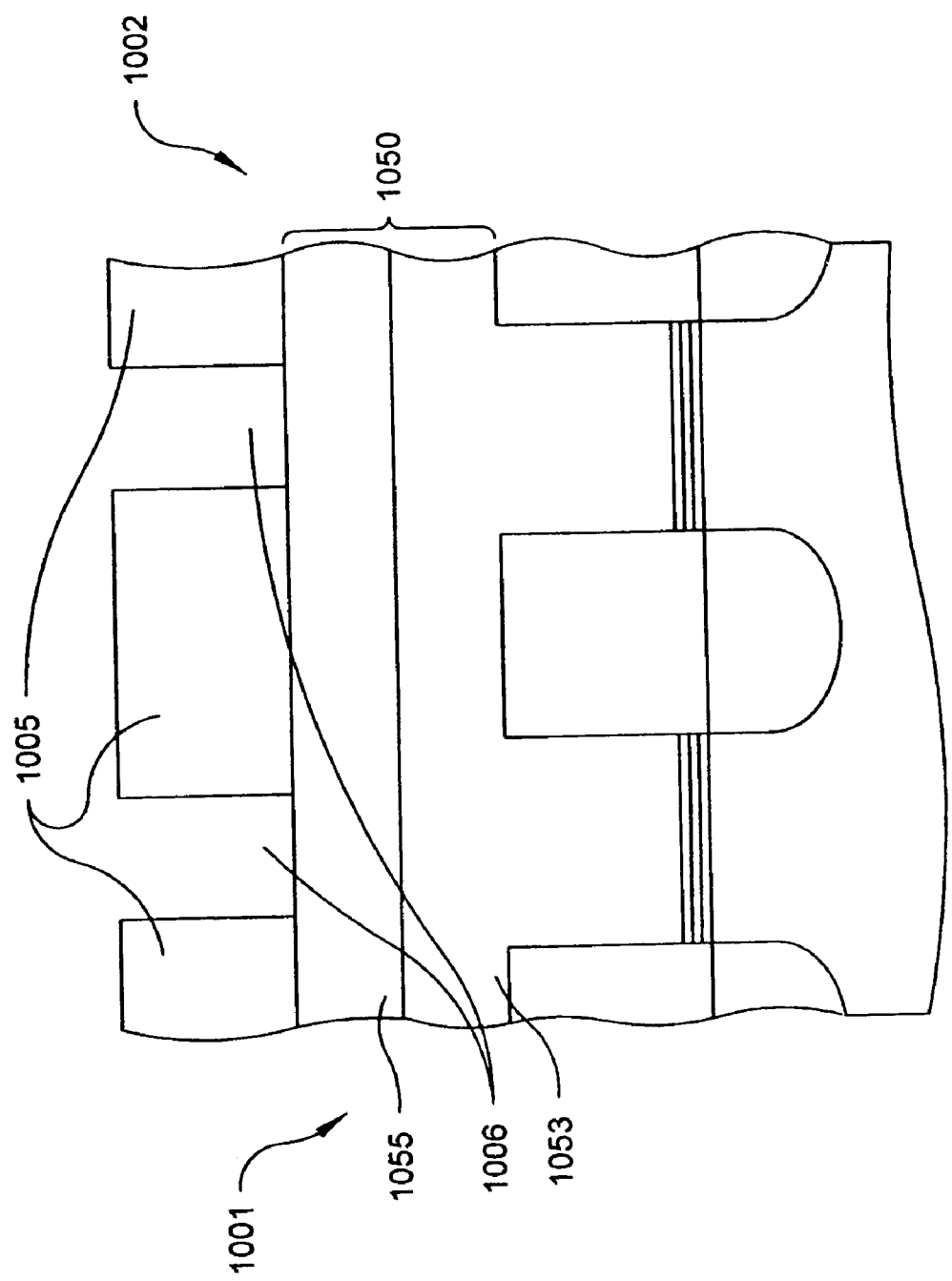

Referring to FIG. 10b, two portions of a first material 1005 are formed above the gate material 1050 above each memory cell, wherein the gate material 1050 is shown as an optionally preferable bi-layer structure comprised of a polysilicon layer 1053 below a metal-containing layer 1055. In FIGS. 10a-10d, the manufacture of two adjacent memory cells 1001, 1002 is schematically depicted. Thus, in FIG. 10b, two portions of the first material 1005 are formed above the gate material over memory cell 1001 and two portions are formed above the gate material over memory cell 1002. The two portions of the first material above each cell are separated by a distance 1006. As shown in FIG. 10b, the pitch of the first material portions may correspond to the pitch of the source/drain regions (bit-lines).

Figure 10C:
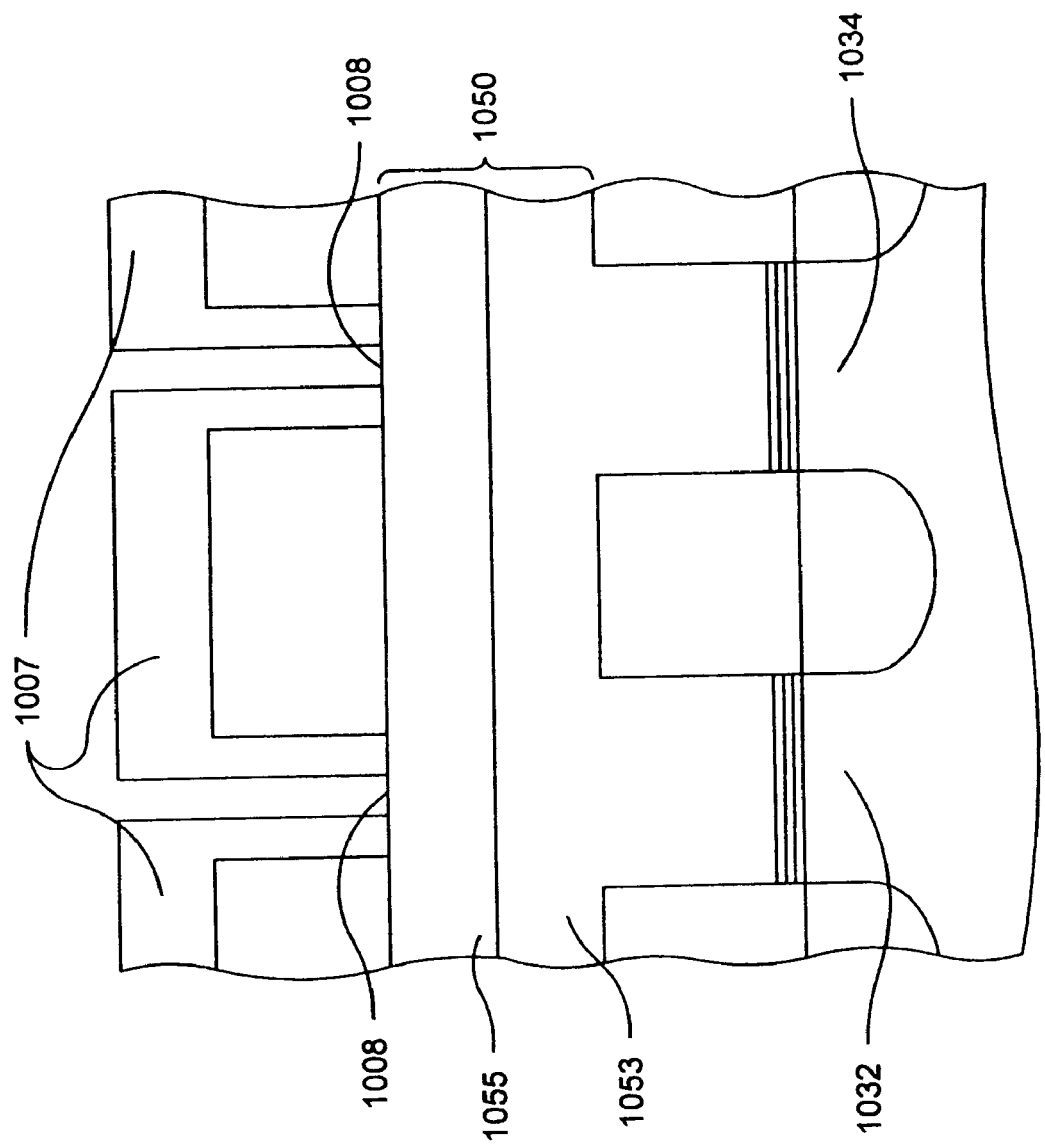

Referring to FIG. 10c, a conformal layer 1007 is deposited on the portions of the first material, such that a nanoarea 1008 above the gate material 1050 is exposed. In the embodiment depicted in FIG. 10c, the nanoarea 1008 is above the metal-containing layer 1055 of the bi-layer structure comprised of polysilicon layer 1053 and metal-containing layer 1055. The nanoareas preferably bisect the areas above the channel regions 1032, 1034.

Figure 10D:
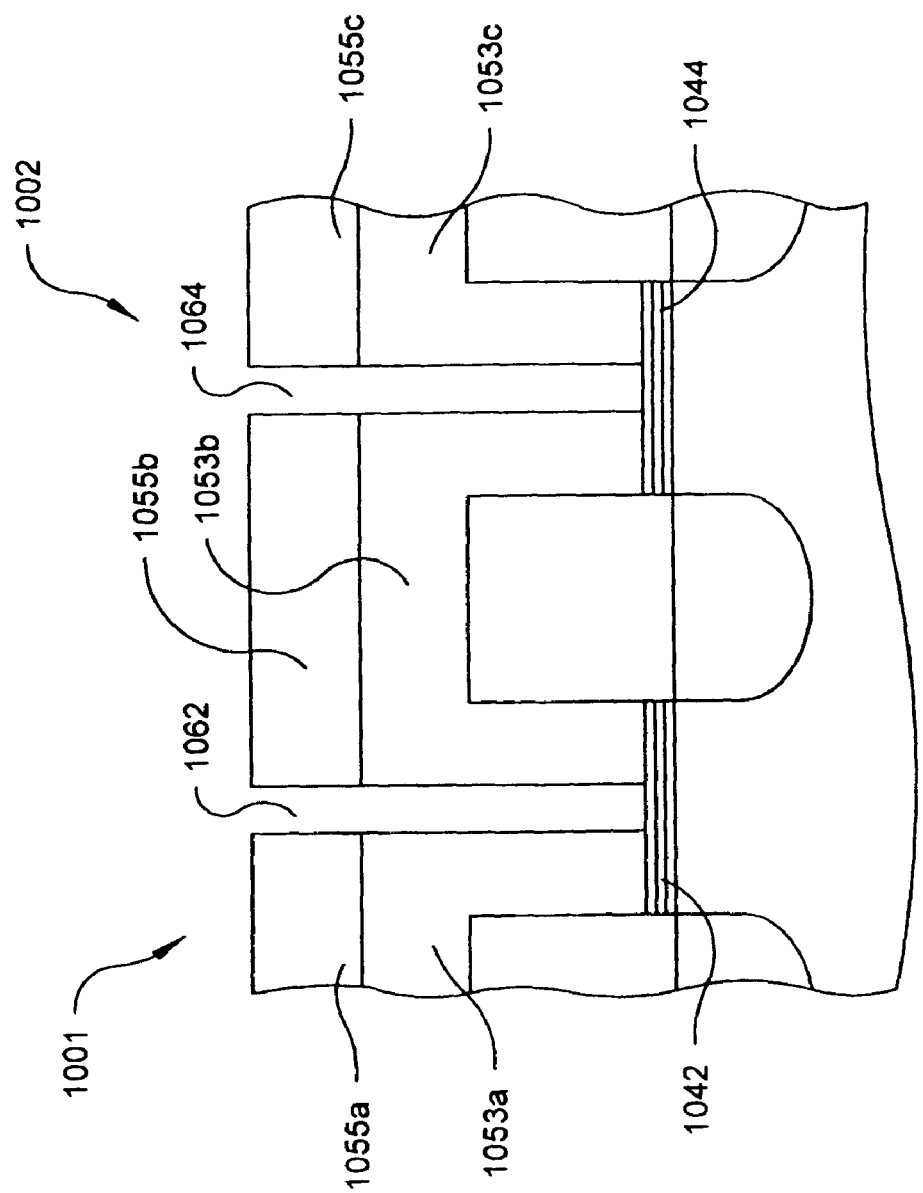

Referring to FIG. 10d, gate material previously exposed below the nanoarea has been removed forming first nanospaces 1062, 1064. First nanospace 1062 separates one gate comprised of polysilicon layer 1053a and metal-containing layer 1055a from a second gate comprised of polysilicon layer 1053b and metal-containing layer 1055b in memory cell 1001. First nanospace 1064 separates the gate comprised of polysilicon layer 1053b and metal-containing layer 1055b from a second gate comprised of polysilicon layer 1053c and metal-containing layer 1055c in memory cell 1002. In the embodiment shown in FIG. 10d, removal of the material exposed below the first nanoareas is carried out to the extent that removal of the material is stopped after the gate material has been removed and a first gate and second gate are formed, but the charge-trapping structures 1042, 1044 have not been separated into discrete charge-trapping regions. In additional embodiments of the invention not shown in FIGS. 10a-10d, removal of the materials can proceed through the charge-trapping structure such that a second nanospace is formed separating the charge-trapping structure into two discrete charge-trapping regions. The portions of the first material and the conformal layer shown in FIG. 10c are removed after the first nanospaces 1062, 1064 are formed.

Figure 11A:
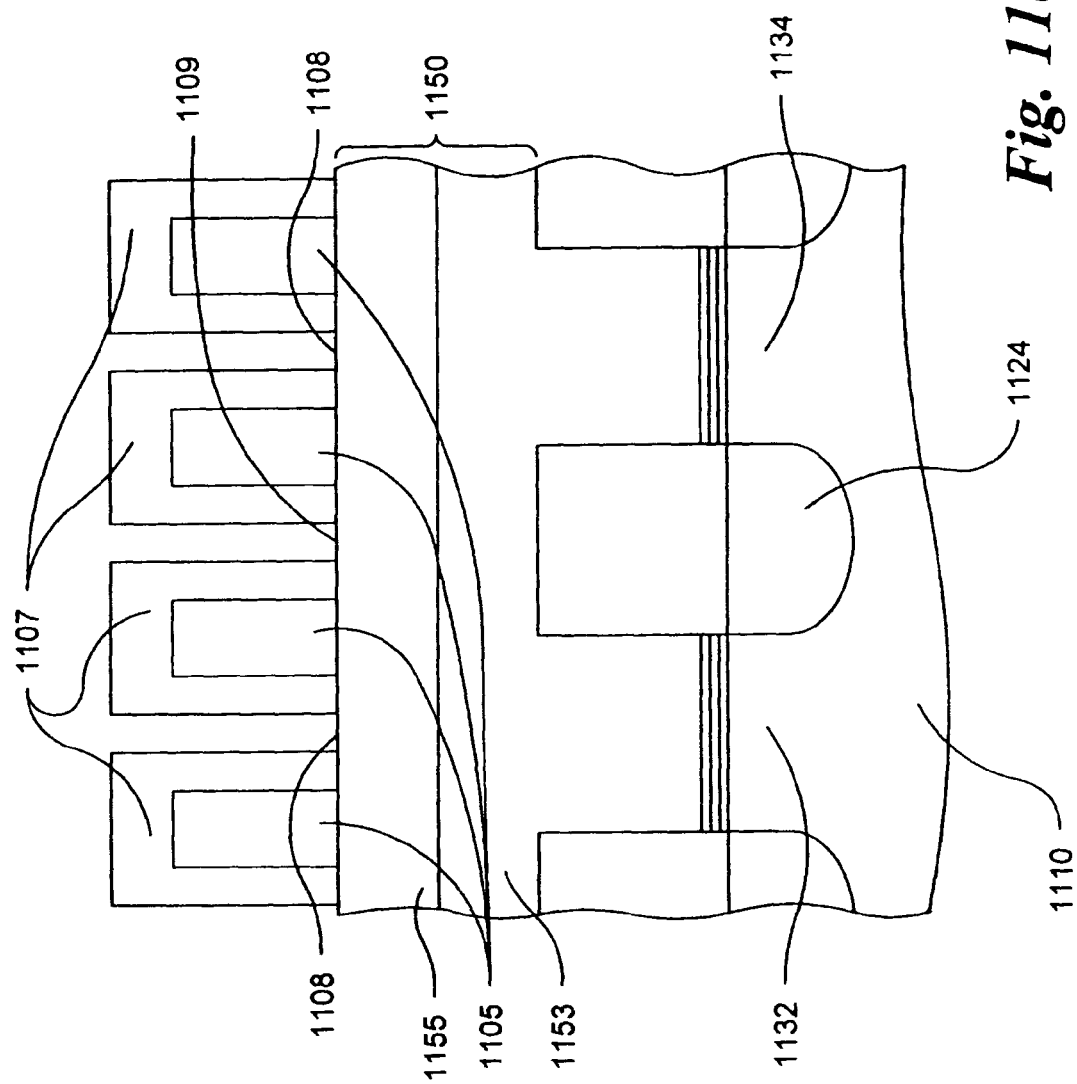
FIGS. 11a-11b are cross-sectional schematic representations illustrating a method of manufacturing in accordance with another embodiment of the present invention at various stages of production.
Figure 11B:
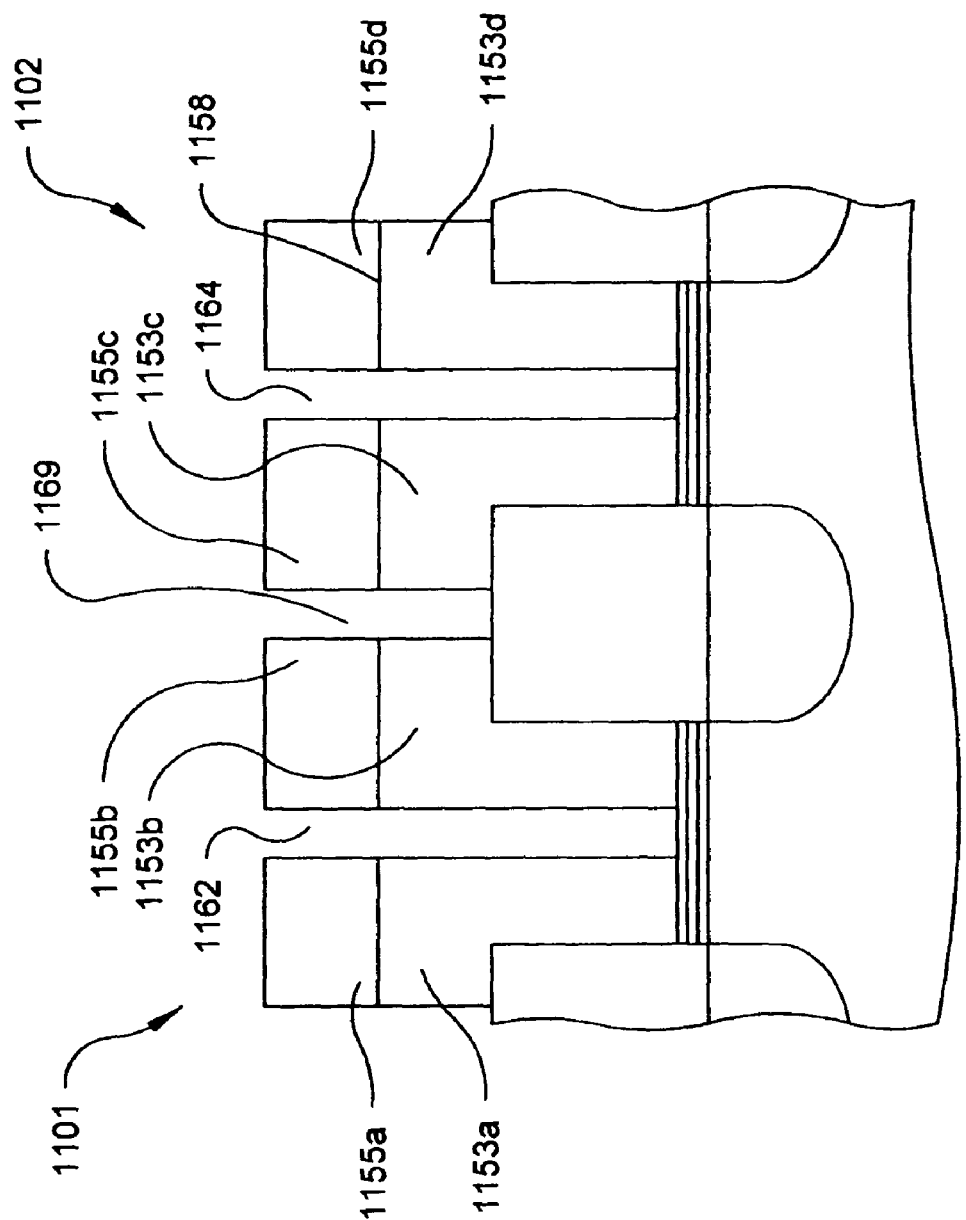

Referring to FIGS. 11a and 11b, another embodiment of a method in accordance with the present invention is shown. In FIG. 11a, a semiconductor substrate 1110 has been provided with a patterning layer comprising portions of a first material 1105 and a conformal layer 1107 disposed above the gate material 1150. In the embodiment depicted in FIGS. 11a and 11b, the gate material 1150 is shown as an optionally preferable bi-layer structure comprised of a polysilicon layer 1153 below a metal-containing layer 1155. In the embodiment shown in FIG. 11a, the pitch of the patterning layer is half that of the source/drain region (bit-line) pitch. The patterning layer shown in FIG. 11a is formed such that a portion of gate material 1150 is exposed below first nanoareas 1108 and another portion of gate material 1150 is exposed below second nanoarea 1109. First nanoareas 1108 can preferably bisect the area above the channel regions 1132, 1134, as shown in FIG. 11a. Second nanoarea 1109 may preferably bisect the area above the source/drain region 1124.

Referring to FIG. 11b, the materials exposed below the first nanoareas and the second nanoarea have been removed to the extent that a first gate and a second gate have been formed in each memory cell shown. For example, in memory cell 1101, a first gate comprised of polysilicon layer 1153a and metal-containing layer 1155a and a second gate comprised of polysilicon layer 1153b and metal-containing layer 1155b are separated by first nanospace 1162, and in memory cell 1102, a first gate comprised of polysilicon layer 1153c and metal-containing layer 1155c and a second gate comprised of polysilicon layer 1153d and metal-containing layer 1155d are separated by a first nanospace 1164. Additionally, the gate comprised of polysilicon layer 1153b and metal-containing layer 1155b and the gate comprised of polysilicon layer 1153c and metal-containing layer 1155c in adjacent memory cells 1101, 1102 are separated by nanospace 1169. The patterning layer is removed after the nanospaces are formed.

Figure 12A:
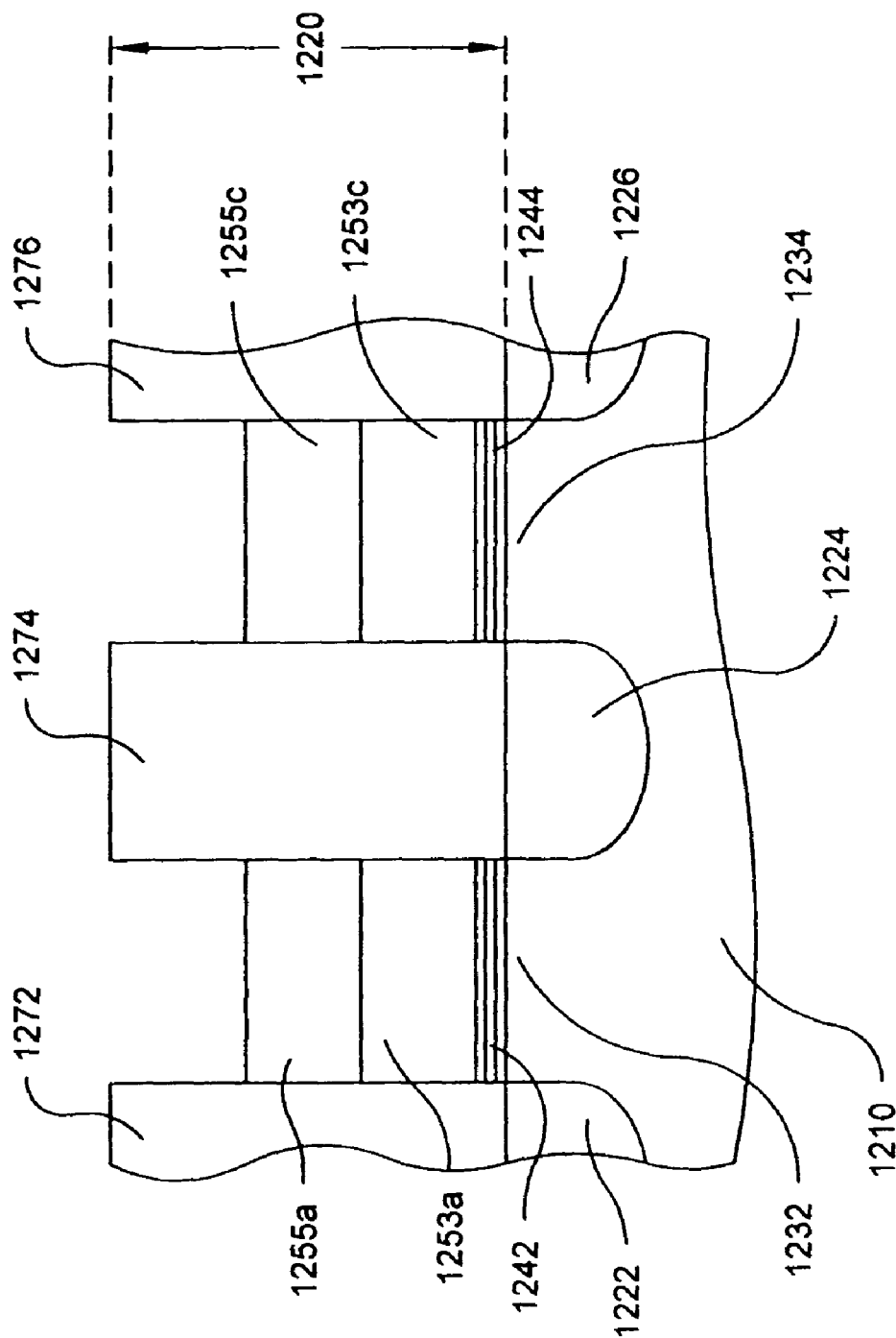
FIGS. 12a-12c are cross-sectional schematic representations illustrating a method of manufacturing in accordance with another embodiment of the present invention at various stages of production.
Figure 12B:
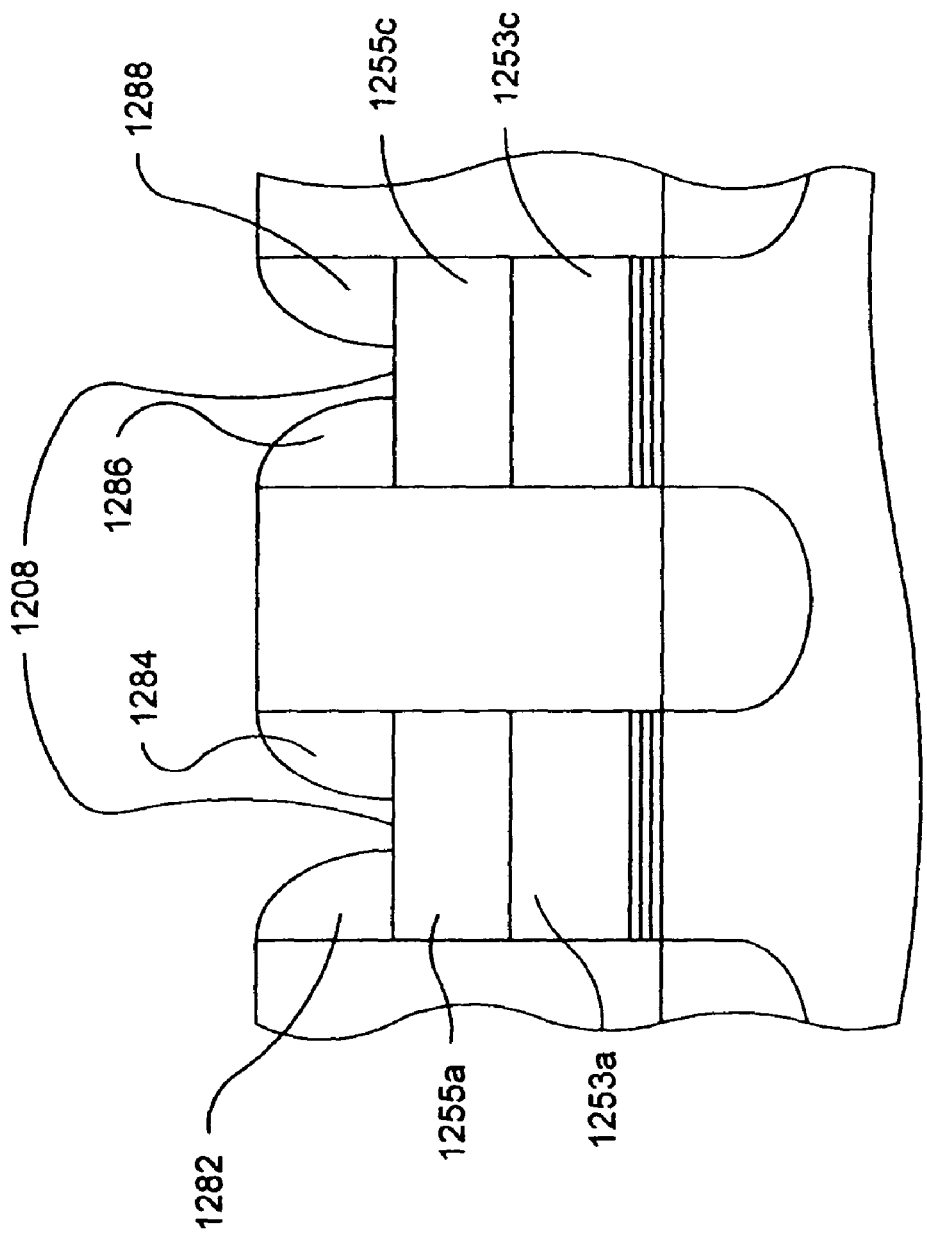
Figure 12C:
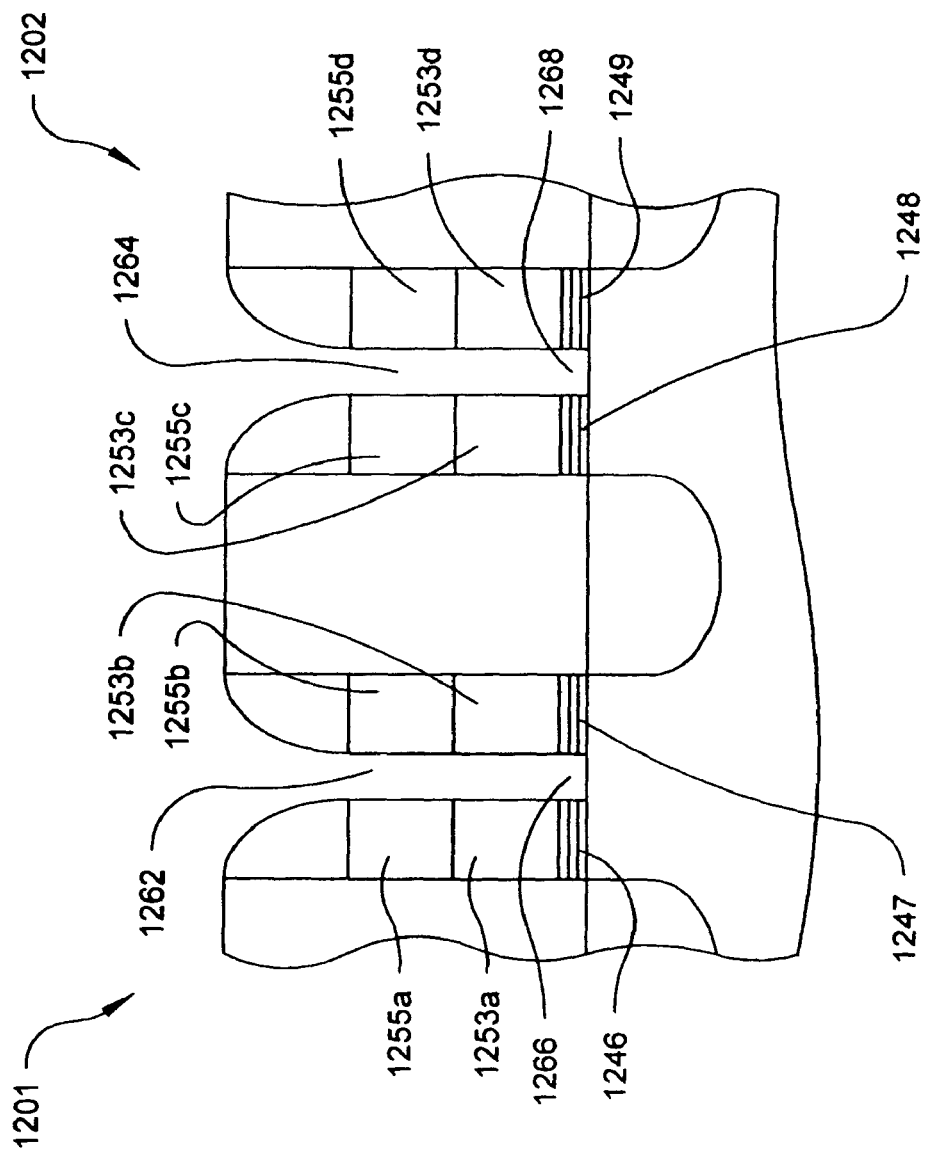

Referring to FIGS. 12a-12c, a method of manufacturing memory cells in accordance with another embodiment of the present invention is described. Referring to FIG. 12a, a semiconductor substrate 1210 is provided having source/drain regions 1222, 1224, 1226, wherein source/drain regions 1222 and 1224 of memory cell 1201 are separated by channel region 1232 and source/drain regions 1224 and 1226 of memory cell 1202 are separated by channel region 1234. A charge-trapping structure 1242, 1244 is disposed above each of the channel regions. A gate material is disposed above each of the charge-trapping regions. In the embodiment depicted in FIGS. 12a-12c, the gate material is shown as an optionally preferable bi-layer structure comprised of a polysilicon layer 1253a, 1253c below a metal-containing layer 1255a, 1255c. Additionally, a first dielectric material 1272, 1274, 1276 is disposed above each of the source/drain regions. The thickness 1220 of the first dielectric materials is greater than the combined thickness of the charge-trapping region and the gate material to which the first dielectric material is proximate.

Referring to FIG. 12b, forming a patterning layer in accordance with embodiments of the invention as depicted in FIGS. 12a-12c comprises disposing second dielectric materials 1282, 1284, 1286, 1288 above the gate material such that first nanoareas 1208 above the channel region are exposed. Second dielectric materials 1282, 1284 are disposed above metal-containing layer 1255a, leaving a first nanoarea 1208 above the gate material exposed. Similarly, second dielectric materials 1286, 1288 are disposed above metal-containing layer 1255c, leaving a first nanoarea 1208 above the gate material exposed.

Referring to FIG. 12c, the materials exposed below the first nanoareas can be removed to the extent that a portion of the charge-trapping structure is removed forming second nanospaces 1266 and 1268 which separate discrete charge-trapping regions 1246, 1247, 1248, 1249. Removal of the exposed materials also forms first nanospaces 1262 and 1264, thus forming a first gate comprised of polysilicon layer 1253a and metal-containing layer 1255a and a second gate comprised of polysilicon layer 1253b and metal-containing layer 1255b in memory cell 1201 and a first gate comprised of polysilicon layer 1253c and metal-containing layer 1255c and a second gate comprised of polysilicon layer 1253d and metal-containing layer 1255d in memory cell 1202. In the embodiment shown in FIG. 12c, the first nanospaces and the second nanospaces are equally sized in width and are aligned horizontally.

Another embodiment of a method of manufacturing memory cells in accordance with the present invention includes providing a semiconductor substrate having a charge-trapping structure disposed above a surface of the semiconductor substrate, and a gate material disposed above the charge-trapping structure; forming two gate patterns above the gate material, wherein the two gate patterns are separated such that a first nanoarea above the gate material between the two gate patterns and areas adjacent to the opposite sides of the gate patterns above the gate material are exposed; removing the exposed gate material below the nanoarea and areas adjacent to the opposite sides of the gate patterns to form a first gate and a second gate separated by a nanospace; forming a spacer dielectric material between the first gate and the second gate and on opposite sides of the first gate and the second gate; and forming a source region and a drain region in the semiconductor substrate.

Figure 13A:
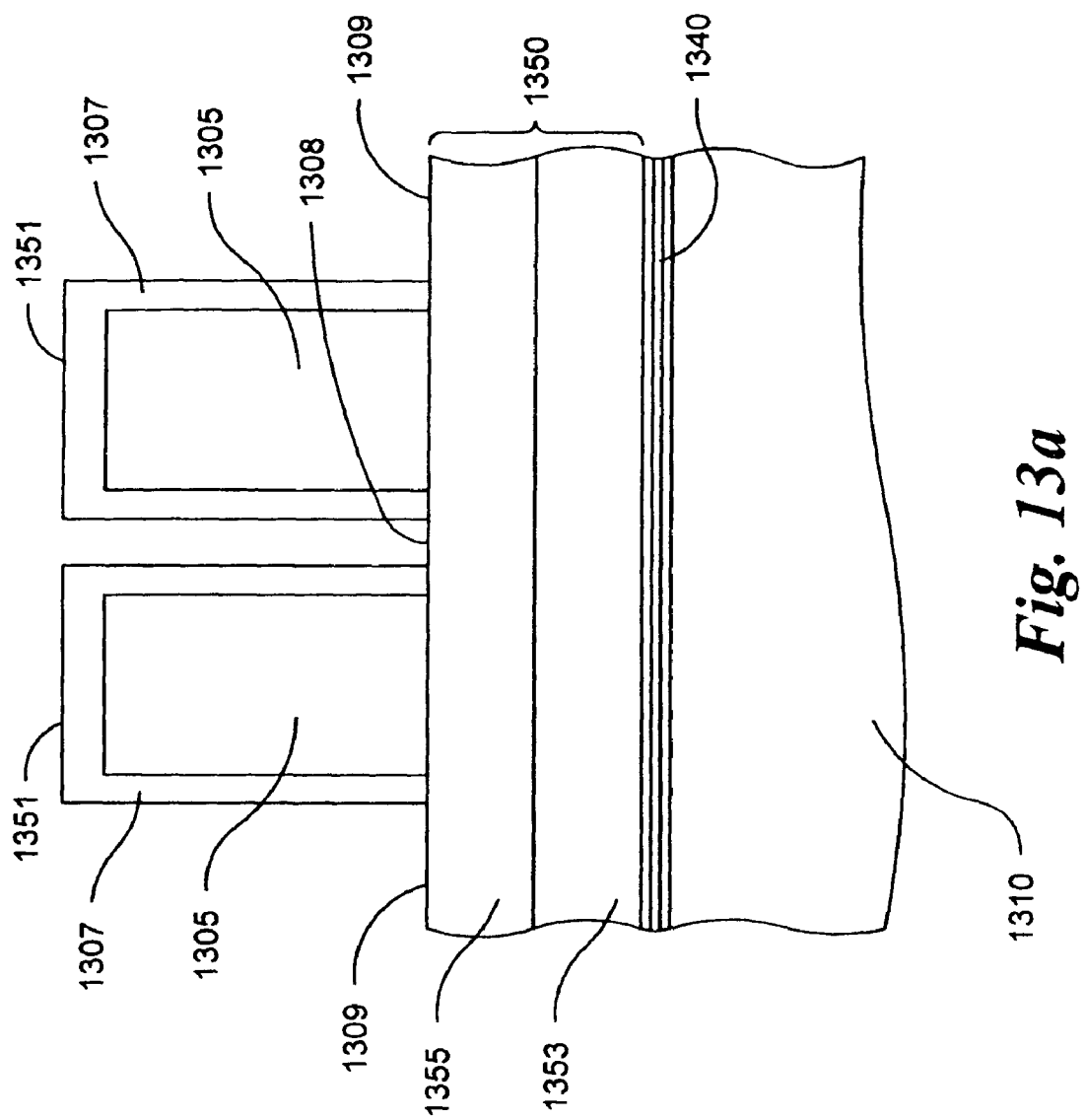
FIGS. 13a-13c are cross-sectional schematic representations illustrating a method of manufacturing in accordance with another embodiment of the present invention at various stages of production.
Figure 13B:
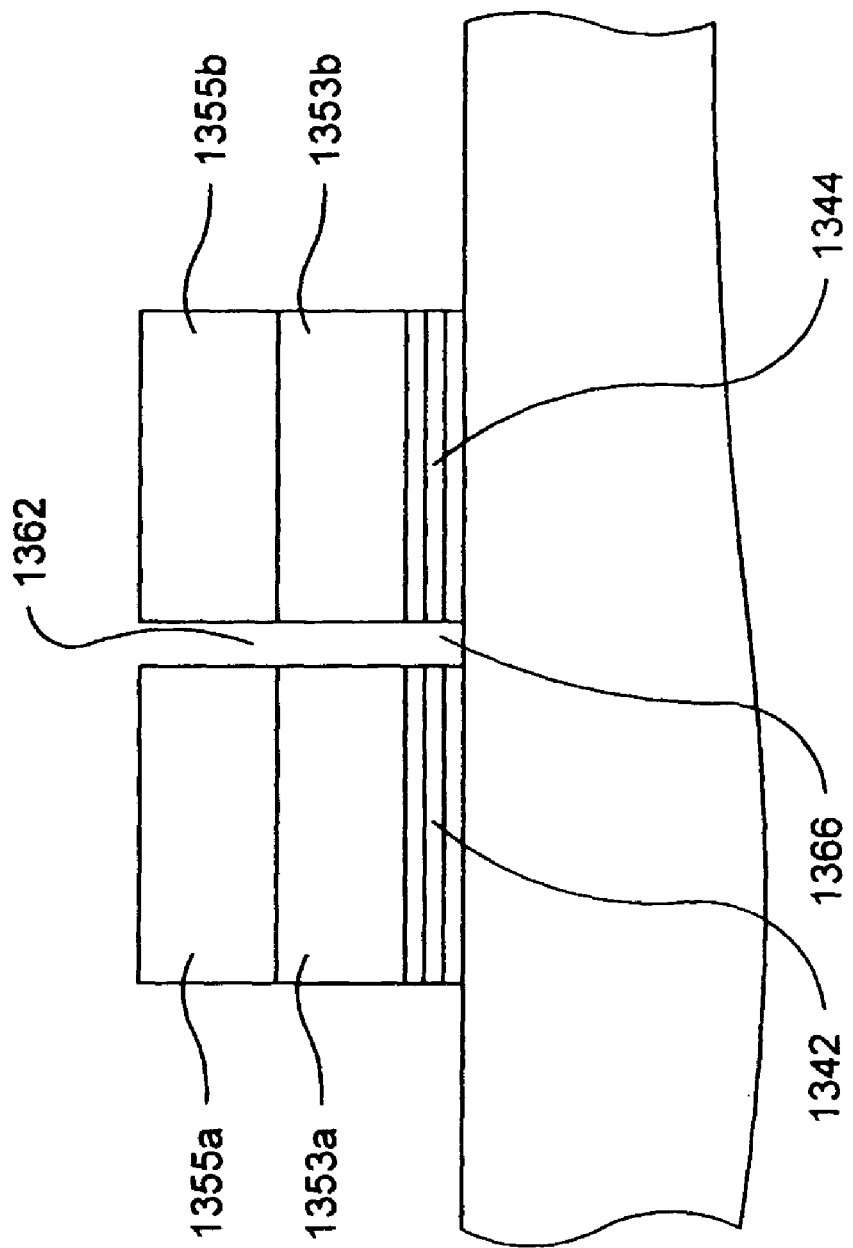
Figure 13C:
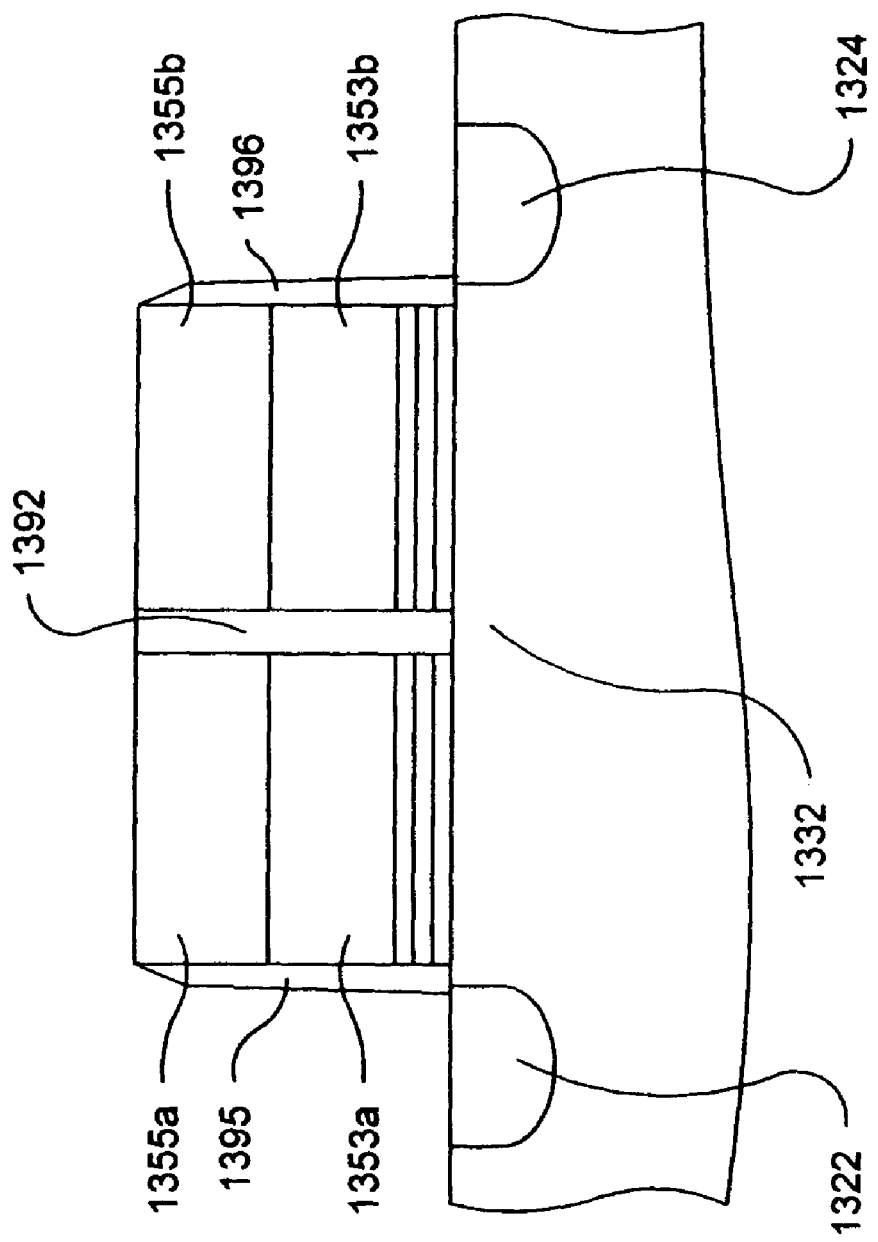

Referring to FIGS. 13a-13c, a method of manufacturing memory cells in accordance with another embodiment of the present invention is described. In FIG. 13a, a semiconductor substrate 1310 is provided having a charge-trapping structure 1340 disposed above the surface of the substrate, and a gate material 1350, shown as an optionally preferable bi-layer of a polysilicon material 1353/metal-containing material 1355, disposed above the charge-trapping structure. Forming a first gate and a second gate in a memory cell includes disposing two gate patterns 1351, which may each be formed as a portion of a first material 1305 and a conformal layer 1307, above the gate material such that first nanoarea 1308 above the gate material between the two gate patterns is exposed and the areas 1309 adjacent to the opposite sides of the gate patterns are exposed. The first material 1305 and the conformal layer 1307 can include various materials as described above with reference to the patterning layer used in other embodiments according to the present invention.

Referring to FIG. 13b, the materials below the exposed nanoarea and exposed areas adjacent to the opposite sides of the gate patterns are removed to form a first nanospace 1362 between a first gate comprised of polysilicon layer 1353a and metal-containing layer 1355a and a second gate comprised of polysilicon layer 1353b and metal-containing layer 1355b. As shown in FIG. 13b, the materials exposed below nanoarea can be removed to the extent that portions of the charge-trapping structure are removed forming discrete charge-trapping regions 1342 and 1344 separated by second nanospace 1366. In the embodiment shown in FIG. 13b, the first nanospace and the second nanospace are equal in width and the first nanospace is horizontally aligned above the second nanospace. The gate patterns are removed subsequent to the removal of materials exposed below the nanoarea and areas adjacent to the opposite sides of the gate patterns. Removal of exposed materials and the gate patterns can be carried out as described above in other embodiments of the invention.

Referring to FIG. 13c, spacer dielectric materials 1392, 1395, 1396 are formed between the first gate comprised of polysilicon layer 1353a and metal-containing layer 1355a and the second gate comprised of polysilicon layer 1353b and metal-containing layer 1355b, and on opposite sides of the first gate and the second gate, respectively. Subsequent to the formation of the spacer dielectric materials, source/drain regions 1322, 1324 can be formed by, for example, ion implantation, and are separated by channel region 1332.

The present invention also includes methods of operating non-volatile memory cells and arrays comprising non-volatile memory cells having at least two separate gates above the channel region of the cell.

In general, methods of operating memory cells in accordance with the present invention; wherein the memory cells comprise a semiconductor substrate having a source region and a drain region separated by a channel region, a charge-trapping structure disposed above the channel region of the semiconductor substrate, a first gate disposed above the charge-trapping structure and proximate to the source region, and a second gate disposed above the charge-trapping structure and proximate to the drain region, wherein the first gate and the second gate are separated by a first nanospace, and wherein the memory cell has a threshold voltage; include separate voltage control of each of the source, drain, first gate and second gate.

Accordingly, a source-drain voltage differential $\Delta V^{sd}$ can be applied across the channel region; a first gate voltage $V^{g1}$ can be applied to the first gate; and a second gate voltage $V^{g2}$ can be separately applied to the second gate.

Methods of operation in accordance with the present invention include programming, reading and erasing of either or both bits stored on opposing sides of the charge-trapping structure, and may be accomplished through application of appropriate voltages to each of the source, drain first gate and second gate, and where appropriate (i.e., during reading), detecting the current across the channel.

Methods of operation in accordance with the present invention will be described in further detail with reference to FIG. 14. It is to be understood that while programming, reading and erasing are described herein with reference to FIG. 14 where source/drain region 1422 is depicted as a source region and source/drain region 1424 is depicted as the drain, and wherein bit-1 (charge storage below gate 1454) is manipulated, any operation described herein can be performed oppositely on bit-2 (charge storage below gate 1452) by employing source/drain region 1424 as a source region and source/drain region 1422 as the drain.

Figure 14:
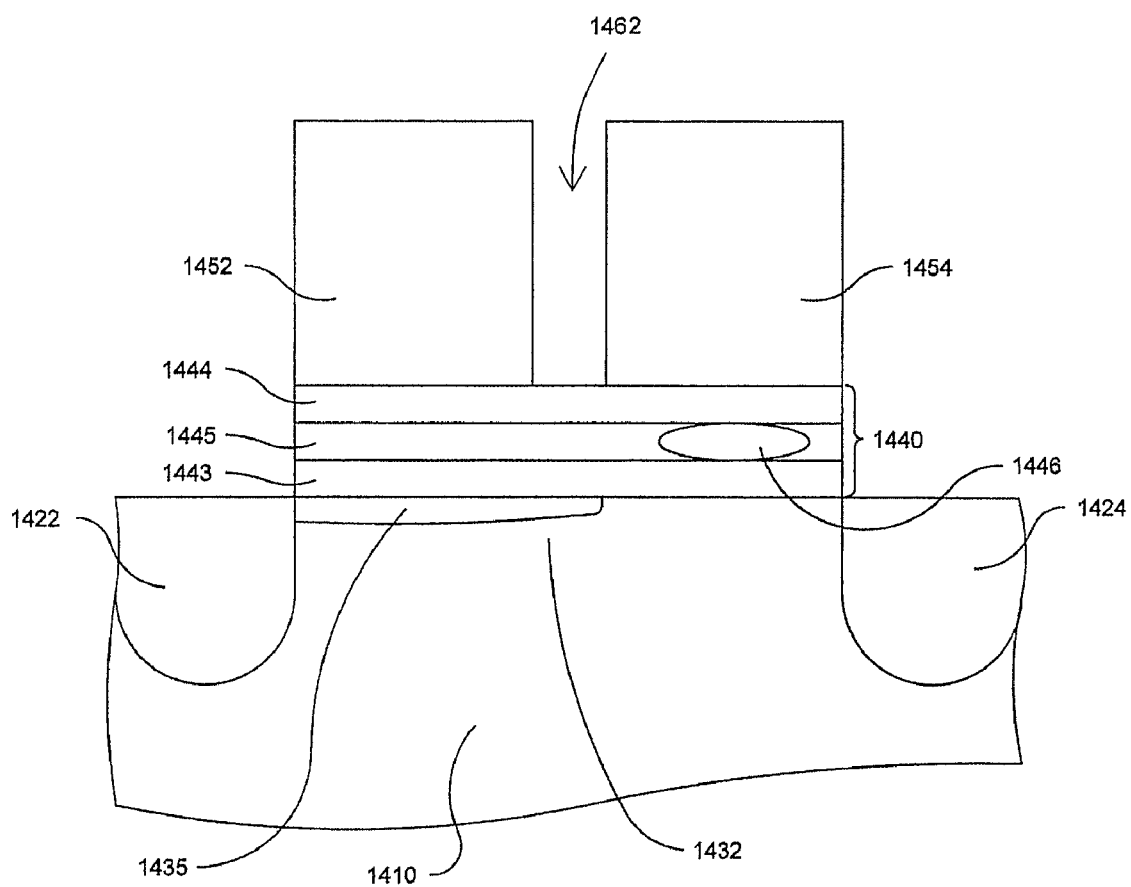
FIG. 14 is a cross-sectional schematic representation of memory cell operation in accordance with various embodiments of the present invention.

Referring to FIG. 14, a memory cell to be programmed, read or erased in accordance with the present invention includes a semiconductor substrate 1410 having a source region 1422 and a drain region 1424 separated by a channel region 1432. The memory cell includes a charge-trapping structure 1440 disposed above the channel region. In the memory cell depicted in FIG. 14, the charge-trapping structure is shown as an optionally preferable ONO layer, wherein middle charge-storage layer 1445 is sandwiched between bottom insulating layer 1443 and top insulating layer 1444. The memory cell also includes a first gate 1452 and a second gate 1454 separated by a first nanospace 1462.

Bit-1, the charge storage area 1446 in the charge storage layer 1445 under the second gate 1454 can be programmed (i.e., charge carriers trapped within the storage area) by applying a significant source-drain voltage differential $\Delta V^{sd}$ across the channel region, applying a first gate voltage $V^{g1}$ to the first gate which is lesser than the threshold voltage of the memory cell and applying a second gate voltage $V^{g2}$ to the second gate which is greater than the threshold voltage of the memory cell. A significant source-drain voltage differential $\Delta V^{sd}$ can be from about 4 to about 8 volts. For example, a voltage of +8 V can be applied to the source 1422 and 0V can be applied to the drain 1424. Additionally, if for example, the threshold voltage of the cell is about 5 V, a first gate voltage of from about 1 to about 2 V can be applied to the first gate 1452 and a second gate voltage of from about 5.5 to about 7 V can be applied to the second gate. In this manner, electrons migrate from the source region to the drain region across the channel and become energized under the increased voltage of the second gate to such an extent that they can tunnel through the bottom insulating layer 1443 and become trapped in the middle charge-storage layer 1445 in the vicinity of charge storage area 1446. By limiting the first gate voltage below the threshold voltage of the memory cell unintentional programming of the charge storage area below the first gate can be avoided, but the first gate voltage provided allows a vertical electrical field to be applied to that portion of the channel permitting charge carrier (i.e., electron) movement across the channel.

Reading of bit-1, i.e., determining the presence of a stored charge in charge storage area 1446, can be accomplished in a forward reading direction, by applying a reading-level source-drain voltage differential $\Delta V^{sd}$ across the channel region, applying a first gate voltage $V^{g1}$ to the first gate which is greater than the threshold voltage of the memory cell, applying a second gate voltage $V^{g2}$ to the second gate which is lesser than the threshold voltage of the memory cell and determining the channel current at the drain. A reading-level source-drain voltage differential $\Delta V^{sd}$ can be from about 1.5 to about 2 volts. For example, a voltage of +2 V can be applied to the source 1422 and 0V can be applied to the drain 1424. Additionally, if for example, the threshold voltage of the cell is about 5 V, a first gate voltage of from about 5.5 to about 7 V can be applied to the first gate 1452 and a second gate voltage of from about 1.5 to about 2V can be applied to the second gate. The greater than threshold voltage at first gate 1452 creates an inversion region 1435 below first gate 1452. The presence of a stored charge (i.e., programmed bit) in charge storage site 1466 and the less than threshold voltage at second gate 1454 prevents the migration of charge carriers all the way across the channel resulting in minimal channel current detected at the drain 1424.

Erasing bit-1, i.e., removing the stored charge from the charge storage area 1446, can be accomplished by applying a negative second gate voltage to the second gate and applying a zero voltage to the source and drain (i.e., grounding the source and drain). The voltage of the first gate can be same as that of the second gate in order to erase bit-2 (i.e., the charge stored under the first gate). A negative voltage can be applied to multiple gates in a block and their associated source/drain regions grounded. This will perform a block erasing operation wherein all of the trapped charge in the block can be erased. Alternatively, specific, single bits can be erased using a band-to-band erasing method. For example, to erase bit-1 in a non-block erase operation, (i.e., the charge stored in area 1446), the a negative voltage of, for example, −5~−8 V, can be applied to the second gate and a positive voltage of, for example, +5~+8 V, can be applied to the drain 1424, such that a band-to-band hot hole is injected to neutralize the electrons trapped under the second gate 1454. The voltage of the first gate is kept slightly negative such that the channel is turned-off and the source 1422 is grounded.

Methods of operating memory cells as described above can be applied to cells or blocks of cells arranged in an array in accordance with the present invention by applying appropriate voltages to individual gates and source/drain regions (or bit-lines). Voltages may be applied to a series of gates and or an entire row of cell source regions or drain regions aligned as a continuous bit-line through conductive (e.g., metallic) interconnections and may be controlled via appropriate switch gate architectures known in the art or to be developed.

It will be appreciated by those skilled in the art that changes could be made to the embodiments described above without departing from the broad inventive concept thereof. It is understood, therefore, that this invention is not limited to the particular embodiments disclosed, but it is intended to cover modifications within the spirit and scope of the present invention as defined by the appended claims.

What is claimed is:

1. A memory cell comprising:
 a semiconductor substrate having a source region and a drain region separated by a channel region;
 a charge-trapping structure disposed above the channel region of the semiconductor substrate;
 a first gate disposed above the charge-trapping structure and proximate to the source region; and
 a second gate disposed above the charge-trapping structure and proximate to the drain region;
 a dielectric material disposed under the first gate and the second gate and over the source region or the drain region, directly contacts the charge-trapping structure;
 wherein the first gate and the second gate are separated by a first nanospace and the charge-trapping structure includes a first charge storage region under the first gate and a second charge storage region under the second gate.

2. The memory cell according to claim 1, wherein the charge-trapping structure comprises two discrete charge-trapping regions separated by a second nanospace, wherein one charge-trapping region is proximate to the source region and the other charge-trapping region is proximate to the drain region.

3. The memory cell according to claim 2, wherein the first nanospace and the second nanospace are substantially equal in width and the first nanospace is horizontally aligned above the second nanospace.

4. The memory cell according to claim 1, wherein the first gate and the second gate each comprise a layer of polycrystalline silicon disposed above the charge-trapping structure and a metal-containing layer disposed above the polycrystalline silicon layer.

5. The memory cell according to claim 4, wherein the charge-trapping structure comprises two discrete charge-trapping regions separated by a second nanospace, wherein one charge-trapping region is proximate to the source region and the other charge-trapping region is proximate to the drain region.

6. The memory cell according to claim 1, wherein the charge-trapping structure comprises a multi-layer structure selected from the group consisting of an ONO tri-layer, an oxide/nitride bi-layer, a nitride/oxide bi-layer, an ONONO multilayer, an oxide/tantalum oxide bi-layer, an oxide/tantalum oxide/oxide tri-layer, an oxide/strontium titanate bi-layer, an oxide/barium strontium titanate bi-layer, an oxide/strontium titanate/oxide tri-layer, an oxide/strontium titanate/barium strontium titanate tri-layer, and an oxide/hafnium oxide/oxide tri-layer.

7. The memory cell according to claim 6, wherein the charge-trapping structure comprises two discrete charge-trapping regions separated by a second nanospace, wherein one charge-trapping region is proximate to the source region and the other charge-trapping region is proximate to the drain region.

8. The memory cell according to claim 1, wherein the charge-trapping structure comprises an ONO tri-layer.

9. The memory cell according to claim 8, wherein the charge-trapping structure comprises two discrete charge-trapping regions separated by a second nanospace, wherein one charge-trapping region is proximate to the source region and the other charge-trapping region is proximate to the drain region.

10. The memory cell according to claim 1, wherein the dielectric material comprises a high density plasma oxide.

11. The memory cell according to claim 1, wherein the dielectric material does not extend out of the source region or the drain region.

12. The memory cell according to claim 1, wherein the top surface of the dielectric material is higher than a top surface of the charge-trapping structure.

13. A memory array comprising a plurality of memory cells according to claim 1.

* * * * *